(12) United States Patent
Kobayashi et al.

(10) Patent No.: US 8,436,249 B2
(45) Date of Patent: May 7, 2013

(54) WIRING SUBSTRATE, ELECTRONIC DEVICE, AND METHOD OF MANUFACTURING WIRING SUBSTRATE

(75) Inventors: Kazutaka Kobayashi, Nagano (JP); Tadashi Arai, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 85 days.

(21) Appl. No.: 13/280,682

(22) Filed: Oct. 25, 2011

(65) Prior Publication Data
US 2012/0103663 A1 May 3, 2012

(30) Foreign Application Priority Data

Oct. 29, 2010 (JP) .................................. 2010-243728

(51) Int. Cl.
*H05K 1/00* (2006.01)
*H05K 3/30* (2006.01)

(52) U.S. Cl.
USPC ............................... 174/252; 174/260; 29/832

(58) Field of Classification Search .................. 174/252, 174/260; 29/832–841
See application file for complete search history.

(56) References Cited

FOREIGN PATENT DOCUMENTS

| JP | 64-047058 | 2/1989 |
| JP | 2007-266172 | 10/2007 |

*Primary Examiner* — Jeremy Norris
(74) *Attorney, Agent, or Firm* — IPUSA, PLLC

(57) ABSTRACT

A wiring substrate includes a heat sink to dissipate heat generated in an electronic part mounted in an electronic part loading area on a principal surface of the wiring substrate, an encapsulation resin to cover the heat sink, an inner connection terminal having an end face electrically connected to an electrode of the electronic part, and an outer connection terminal electrically connected to the inner connection terminal via a wiring and having an end face for inputting and outputting of a signal with an external device. The encapsulation resin is arranged to cover a part of the wiring, the inner connection terminal except the end face, and the outer connection terminal except the end face. A surface of the heat sink, the end face of the inner connection terminal, and the end face of the outer connection terminal are flush with and exposed to the principal surface.

14 Claims, 24 Drawing Sheets

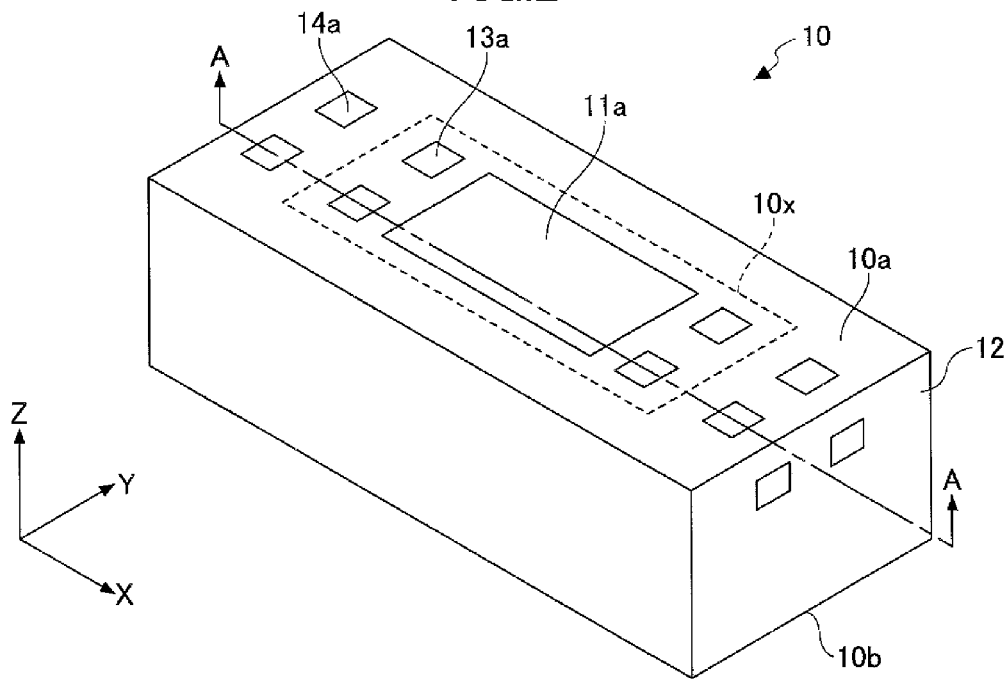
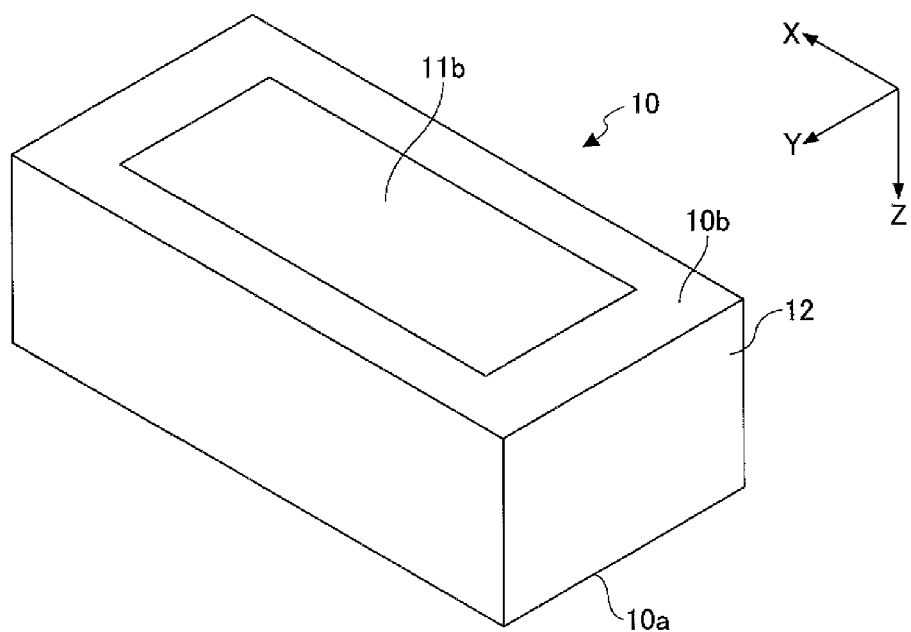

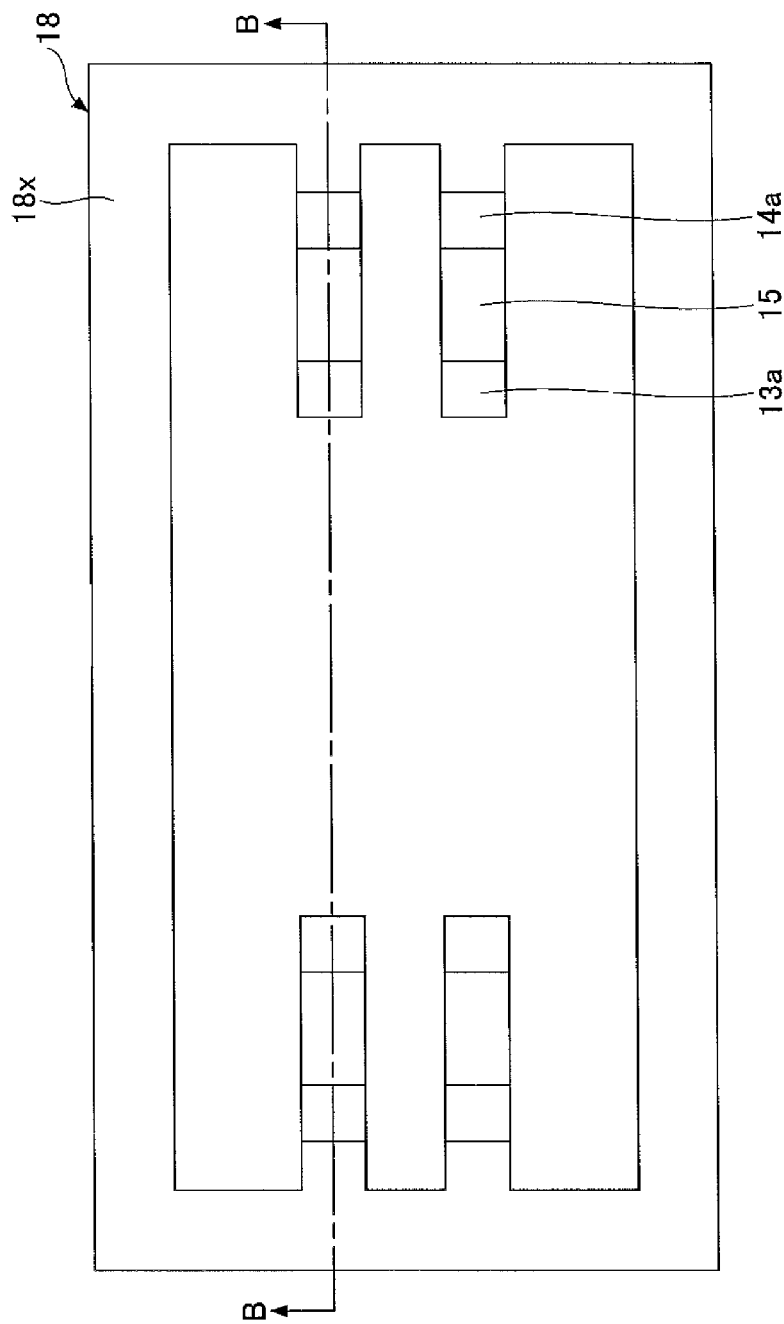

FIG.5
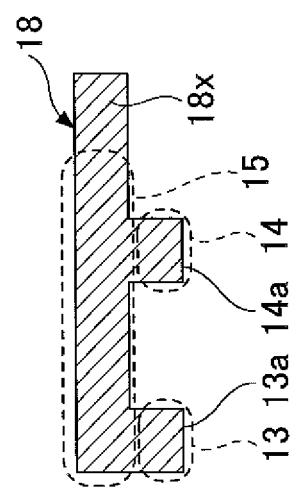
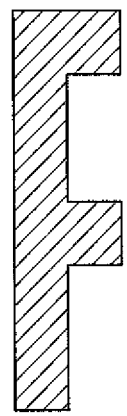

WIRING SUBSTRATE, ELECTRONIC DEVICE, AND METHOD OF MANUFACTURING WIRING SUBSTRATE

CROSS-REFERENCE TO RELATED APPLICATIONS

This application is based upon and claims the benefit of priority of the prior Japanese patent application No. 2010-243728, filed on Oct. 29, 2010, the entire contents of which are incorporated herein by reference in their entirety.

FIELD

The embodiments discussed herein are directed to a wiring substrate including a heat sink, an electronic device including an electronic part mounted on the wiring substrate, and a method of manufacturing the wiring substrate.

BACKGROUND

In recent years, with an increase of integration of semiconductor chips, there has been a demand for efficiently dissipating the heat generated in semiconductor chips to the outside. For this purpose, a wiring substrate including a heat sink is proposed as a wiring substrate for mounting a semiconductor chip thereon.

For example, Japanese Laid-Open Patent Publication No. 64-047058 discloses a wiring substrate including a heat sink. When the wiring substrate is produced, an insert molding is performed with a heat sink and a lead frame (outer connection terminal) by using a dielectric resin. In the wiring substrate, an inner circuit pattern part (inner connection terminal) is formed on the dielectric resin so that the inner circuit pattern part is electrically connected to a semiconductor chip.

Moreover, Japanese Laid-Open Patent Publication No. 2007-266172 discloses a wiring substrate in which a metal body (heat sink) and an insulation base of a dielectric resin are bonded. In the wiring substrate, an inner connection terminal is formed on one surface of the insulation base, and the inner connection terminal is electrically connected to a semiconductor chip. An outer connection terminal is formed on the other surface of the insulation base. The wiring substrate is arranged so that the inner connection terminal and the outer connection terminal are electrically connected together by a penetration conductor which penetrates the insulation base.

However, in the wiring substrates according to the related art, the inner connection terminal and the outer connection terminal are formed separately, and then the inner connection terminal and the outer connection terminal are connected together. Hence, there has been a problem that the wiring substrates according to the related art have a complicated structure and a complicated manufacturing method.

Moreover, in the wiring substrates according to the related art, the inner connection terminal and the outer connection terminal are formed on the dielectric resin. In order to improve the reliability against a short circuit, it is necessary that only the required portion of the inner connection terminal or the outer connection terminal are exposed, and a solder resist layer which covers the other portion of each terminal is formed. Hence, there has been a problem that the wiring substrates according to the related art have a complicated structure and a complicated manufacturing method.

SUMMARY

In an aspect, the present disclosure provides a wiring substrate which has a simple structure and provides good heat dissipation, an electronic device in which an electronic part is mounted on the wiring substrate, and a method of manufacturing the wiring substrate.

In another aspect, the present disclosure provides a wiring substrate in which an electronic part loading area is formed on a first principal surface, the wiring substrate including: a heat sink arranged to dissipate outside heat generated in an electronic part to be mounted in the electronic part loading area; an encapsulation resin arranged to provide a base of the wiring substrate and cover the heat sink so that a first surface of the heat sink is exposed to the electronic part loading area of the first principal surface; an inner connection terminal formed in the electronic part loading area and having an end face which is exposed to the first principal surface and electrically connected to an electrode of the electronic part; and an outer connection terminal formed outside the electronic part loading area and electrically connected to the inner connection terminal via a wiring, the outer connection terminal having an end face which is exposed to the first principal surface and arranged to input a signal from an external device and output a signal to the external device, wherein the encapsulation resin is arranged to cover at least a part of the wiring, cover the inner connection terminal except the end face thereof, and cover the outer connection terminal except the end face thereof, and wherein the first surface of the heat sink, the end face of the inner connection terminal, and the end face of the outer connection terminal are flush with and exposed to the first principal surface.

In another aspect, the present disclosure provides a method of manufacturing a wiring substrate in which an electronic part loading area is formed on a first principal surface, the method including: a first step of integrally forming an inner connection terminal in the electronic part loading area and an outer connection terminal outside the electronic part loading area, the inner connection terminal having an end face which is exposed to the first principal surface and electrically connected to an electrode of an electronic part to be mounted, and the outer connection terminal electrically connected to the inner connection terminal via a wiring and having an end face which is exposed to the first principal surface and arranged to input a signal from an external device and output a signal to the external device; a second step of temporarily fixing the inner connection terminal, the outer connection terminal and a heat sink, which dissipates outside heat generated in the electronic part, to a surface of a supporting body, so that the end face of the inner connection terminal, the end face of the outer connection terminal and a first surface of the heat sink contact the surface of the supporting body; a third step of forming on the surface of the supporting body an encapsulation resin which provides a base of the wiring substrate and covers the inner connection terminal, the outer connection terminal, the wiring and the heat sink; and a fourth step of removing the supporting body so that the first surface of the heat sink, the end face of the inner connection terminal, and the end face of the outer connection terminal are flush with and exposed to the first principal surface.

The object and advantages of the present disclosure will be realized and attained by means of the elements and combinations particularly pointed out in the claims.

It is to be understood that both the foregoing general description and the following detailed description are exemplary and explanatory and are not restrictive of the present disclosure, as claimed.

BRIEF DESCRIPTION OF DRAWINGS

FIG. 2 is a perspective view showing a top surface of the wiring substrate of the first embodiment.

FIG. 3 is a perspective view showing a bottom surface of the wiring substrate of the first embodiment.

FIG. 4 is a diagram showing a manufacturing method of the wiring substrate of the first embodiment.

FIG. 5 is a diagram showing the manufacturing method of the wiring substrate of the first embodiment.

DESCRIPTION OF EMBODIMENTS

Figure 1:
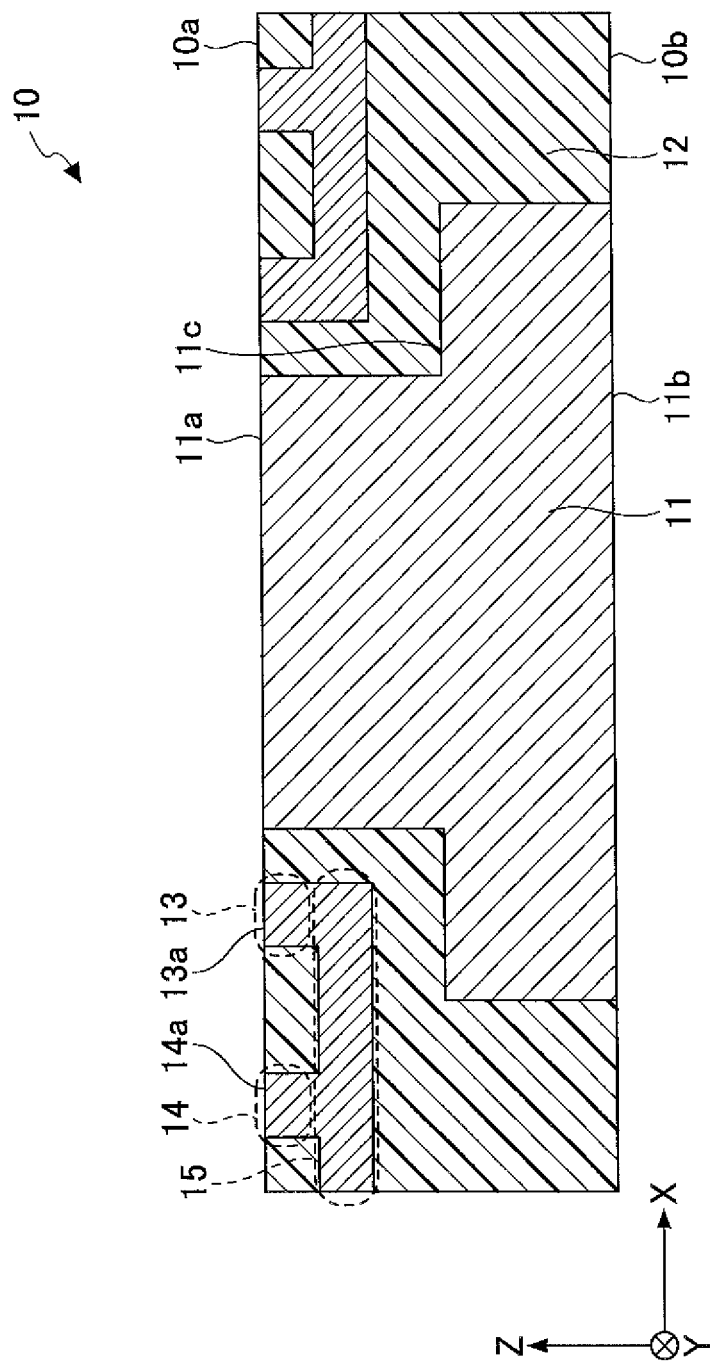
FIG. 1 is a cross-sectional view of a wiring substrate of a first embodiment of the present disclosure.

A description will be given of embodiments of the present disclosure with reference to the accompanying drawings.

In the drawings, the same or corresponding elements are designated by the same or corresponding reference numerals and a duplicate description thereof will be omitted.

First, the structure of a wiring substrate of a first embodiment of the present disclosure will be described. FIG. 1 is a cross-sectional view of the wiring substrate of the first embodiment. FIG. 2 is a perspective view showing a top surface of the wiring substrate of the first embodiment. FIG. 3 is a perspective view showing a bottom surface of the wiring substrate of the first embodiment. FIG. 1 is a cross-sectional view of the wiring substrate taken along the line A-A line indicated in FIG. 2.

As illustrated in FIGS. 1-3, the wiring substrate 10 of the first embodiment includes a heat sink 11, an encapsulation resin 12, an inner connection terminal 13, an outer connection terminal 14, and a wiring 15. The wiring substrate 10 is a wiring substrate on which an electronic part can be mounted. The wiring substrate 10 may be configured to have a horizontal cross-section in the shape of, for example, a rectangle. The size of the wiring substrate 10 may be suitably determined by taking into consideration of the shape and size of an electronic part to be mounted thereon.

Reference numeral 10a denotes a first principal surface (which will be referred to as a first principal surface 10a) of the wiring substrate 10, and reference numeral 10b denotes a second principal surface (which will be referred to as a second principal surface 10b) of the wiring substrate 10.

The first principal surface 10a is a surface on which an electronic part is mounted. Reference numeral 10x denotes an electronic part loading area (which will be referred to as an electronic part loading area 10x) in which an electronic part is mounted.

In the first embodiment, a wiring substrate on which an electronic part with four terminals may be mounted is illustrated as the wiring substrate 10. However, the wiring substrate according to the present disclosure is not limited to this embodiment.

An example of the electronic part to be mounted on the wiring substrate according to the present disclosure may be a semiconductor chip (bare chip), a semiconductor package in which a semiconductor chip is encapsulated with an insulating resin, a high exothermic component containing no semiconductor chip, etc. An example of the high exothermic component containing no semiconductor chip may be a large-current carrying passive component, such as a resistor, an inductor, a capacitor, etc.

The heat sink 11 provides a function that dissipates outside the heat generated in the electronic part mounted in the electronic part loading area 10x on the first principal surface 10a of the wiring substrate 10. A first surface 11a of the heat sink 11 is exposed to the electronic part loading area 10x on the first principal surface 10a. A second surface 11b of the heat sink 11 is exposed to the second principal surface 10b of the wiring substrate 10.

The heat sink 11 has a step portion 11c, and this step portion 11c is formed along the circumference of the first surface 11a when viewed from the vertical direction Z indicated in FIG. 1. With the second surface 11b of the heat sink 11, the heat generated in the electronic part mounted in the electronic part loading area 10x of the wiring substrate 10 can be efficiently radiated to the side of the second principal surface 10b. Alternatively, the heat sink 11 may be formed to have no step portion 11c.

As a material of the heat sink 11, a metal with a high thermal conductivity, such as copper (Cu), aluminum (Al), or aluminum (Al) subjected to alumite finishing, may be used, for example. Alumite finishing is a process which forms an oxide film ($Al_2O_3$) on the surface of an aluminum (Al) material by dipping the aluminum (Al) material in an acidic electrolyte and anodizing the material. Because the oxide film ($Al_2O_3$) formed has minute unevenness on its surface, it is possible to improve the adhesion of the heat sink 11 and the encapsulation resin 12 due to an anchor effect.

A metal layer may be plated on at least one of the first surface 11a and the second surface 11b of the heat sink 11 by an electrolysis electroplating process. As an example of the metal layer, an Au layer, an Ni/Au layer (a metal layer in which a nickel (Ni) layer and a gold (Au) layer are laminated in this order), a Ni/Pd/Au layer (a metal layer in which a nickel (Ni) layer, a palladium (Pd) layer, and a gold (Au) layer are laminated in this order), etc. may be used. By forming such a metal layer, the reliability of electrical connection when a conductive material, such as solder, is formed on the metal layer can be improved.

The encapsulation resin 12 covers the heat sink 11 except the first surface 11a and the second surface 11b, and the encapsulation resin 12 is a base portion for forming the inner connection terminal 13, the outer connection terminal 14, and the wiring 15.

As a material of the encapsulation resin 12, for example, an insulating resin which contains an epoxy resin as a main ingredient may be used. The encapsulation resin 12 may contain inorganic fillers, such as alumina ($Al_2O_3$), boron nitride (BN), or silica ($SiO_2$). It is necessary that the encapsulation resin 12 has a thermal resistance that can withstand the heat generated in the electronic part mounted in the electronic part loading area 10x of the wiring substrate 10.

An end face 13a of the inner connection terminal 13 is exposed to the first principal surface 10a of the wiring substrate 10, and the encapsulation resin 12 covers the inner connection terminal 13 except the end face 13a. The end face 13a of the inner connection terminal 13 is a portion which is electrically connected to an electrode of the electronic part mounted in the electronic part loading area 10x of the wiring substrate 10.

An end face 14a of the outer connection terminal 14 is exposed to the first principal surface 10a of the wiring substrate 10, and the encapsulation resin 12 covers the outer connection terminal 14 except the end face 14a. The end face 14a of the outer connection terminal 14 is a portion which is arranged to input a signal from an external device and output a signal to the external device. The outer connection terminal 14 is electrically connected to the inner connection terminal 13 via the wiring 15. The encapsulation resin 12 covers at least a part of the wiring 15 facing the first principal surface 10a and a part of the wiring 15 facing the second principal surface 10b.

The inner connection terminal 13, the outer connection terminal 14, and the wiring 15 are formed integrally with each other. Specifically, in the first embodiment, a wiring substrate on which an electronic part with four terminals can be mounted is illustrated, and 4 sets of inner connection terminals 13, outer connection terminals 14, and wirings 15 are ultimately formed in the wiring substrate 10. As a material of the inner connection terminal 13, the outer connection terminal 14 and the wiring 15, for example, copper (Cu), etc. may be used.

The end face 13a of the inner connection terminal 13, the end face 14a of the outer connection terminal 14 and the first surface 11a of the heat sink 11 are flush with the first principal surface 10a of the wiring substrate 10. In other words, the end face 13a of the inner connection terminal 13, the end face 14a of the outer connection terminal 14 and the first surface 11a of the heat sink 11 are flush with and exposed from the encapsulation resin 12 to the first principal surface 10a of the wiring substrate 10.

Accordingly, the wiring substrate 10 of the first embodiment is a wiring substrate which has a simple structure and provides good heat dissipation.

Next, a manufacturing method of the wiring substrate of the first embodiment will be described.

FIGS. 4-11 are diagrams for explaining the manufacturing method of the wiring substrate of the first embodiment.

In the step illustrated in FIGS. 4 and 5, a metal plate 18 is prepared, and half etching of the prepared metal plate 18 is performed to form the inner connection terminal 13, the outer connection terminal 14, and the wiring 15 integrally. FIG. 4 is a bottom view of the metal plate 18 subjected to the half etching. FIG. 5 is a cross-sectional view of the metal plate 18 taken along the line B-B indicated in FIG. 4.

As illustrated in FIG. 4, in this step, the portions of the metal plate 18 which are ultimately formed into 4 sets of inner connection terminals 13, outer connection terminals 14, and wirings 15 extend inward from a rectangular outer frame 18x. As a material of the metal plate 18, for example, copper (Cu), etc. may be used. A thickness of the metal plate 18 may be on the order of 1 mm, for example.

Alternatively, the preparation of the metal plate 18 may be performed by a press working using a die.

In the half etching, the surface of the metal plate 18 except the portion which is subjected to the half etching is covered with a mask (not shown), such as a photosensitive material, and the remaining portion of the metal plate 18 uncovered with the mask is removed to a halfway point in a thickness direction of the metal plate 18. In other words, the uncovered portion of the metal plate 18 is removed by etching to a desired thickness (for example, 0.5 mm) at the halfway point, such that the etched portion does not reach the opposite-side surface of the metal plate 18. In a case where the metal plate 18 made of copper (Cu) is used, the half etching may be performed by using, for example, a ferric-chloride solution, a cupric-chloride solution, etc.

Figure 6:
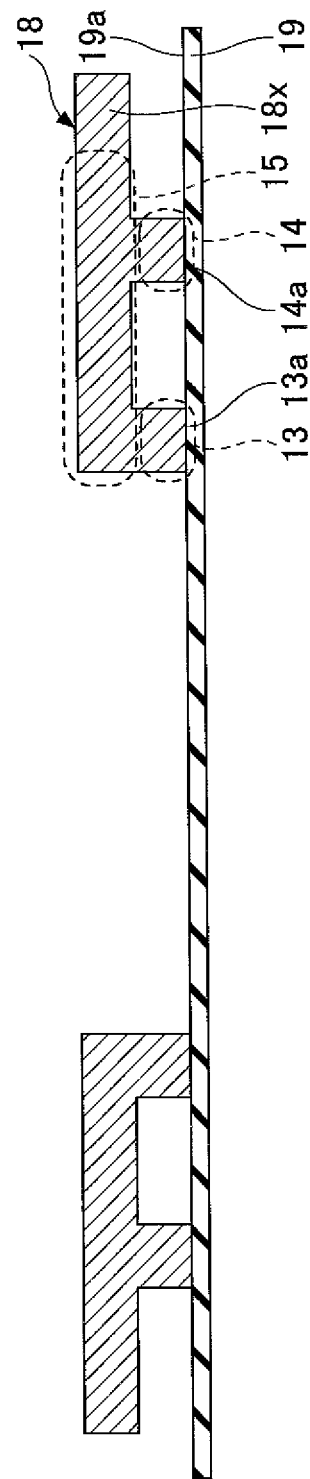
FIG. 6 is a diagram showing the manufacturing method of the wiring substrate of the first embodiment.

Subsequently, in the step illustrated in FIG. 6, a supporting body 19 is prepared, and temporary fixing of the metal plate 18 subjected to the half etching to one surface 19a of the prepared supporting body 19 is performed. Temporary fixing of the metal plate 18 is performed so that the end face 13a of the inner connection terminal 13 and the end face 14a of the outer connection terminal 14 may contact the surface 19a of the supporting body 19. As a material of the supporting body 19, for example, a sheet in which an acrylic resin adhesion material is formed on one surface of the sheet may be used. A thickness of the supporting body 19 may be on the order of 100 micrometers, for example.

Figure 7:
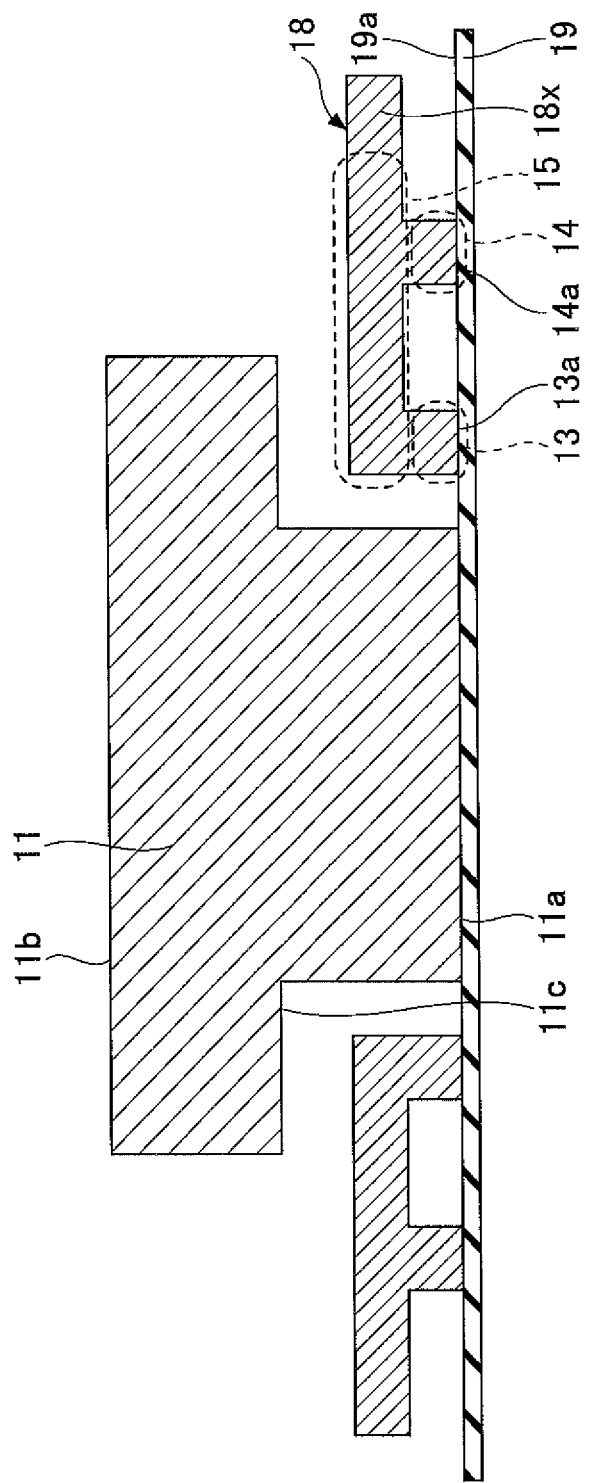
FIG. 7 is a diagram showing the manufacturing method of the wiring substrate of the first embodiment.

Subsequently, in the step illustrated in FIG. 7, temporary fixing of the heat sink 11 to the surface 19a of the supporting body 19 is performed. Temporary fixing of the heat sink 11 is performed so that the first surface 11a of the heat sink 11 may contact the surface 19a of the supporting body 19. The heat sink 11 may be produced by processing a metal with high thermal conductivity, such as copper (Cu) or aluminum (Al). As an example of the metal processing, drawing, cutting, press working, etching, etc. may be used.

In the foregoing embodiment, a single heat sink 11 is illustrated. However, the present disclosure is not limited to this embodiment. Alternatively, a plurality of heat sinks 11 may be formed integrally on the surface 19a of the supporting body 19. Moreover, for the purpose of positioning of the heat sink 11 and the metal plate 18, for example, grooves for engaging the heat sink 11 and the metal plate 18 may be formed.

In a case where the heat sink 11 made of aluminum (Al) is used, alumite finishing of the heat sink 11 may be performed after the heat sink 11 is formed into a predetermined configuration. When the heat sink 11 of aluminum (Al) subjected to alumite finishing is used, an oxide film ($Al_2O_3$) formed in the surface of the heat sink 11 has minute unevenness. The adhesion of the heat sink 11 and the encapsulation resin 12 in the subsequent step illustrated in FIG. 8 can be improved because of an anchor effect.

Subsequently, in the step illustrated in FIG. 8, an encapsulation resin 12 is formed on the surface 19a of the supporting body 19 so that the encapsulation resin 12 covers the heat sink 11, the inner connection terminal 13, the outer connection terminal 14, and the wiring 15. The encapsulation resin 12 may be formed by compression molding, for example. As a material of the encapsulation resin 12, for example, an insulating resin which contains an epoxy resin as a main ingredient may be used. The encapsulation resin 12 may contain inorganic fillers, such as alumina ($Al_2O_3$), boron nitride (BN), or silica ($SiO_2$).

In this step, it is preferred that the encapsulation resin 12 is not formed on the first surface 11a and the second surface 11b of the heat sink 11. However, depending on the conditions of compression molding, a thin film of the encapsulation resin 12 may be formed there.

Figure 9:
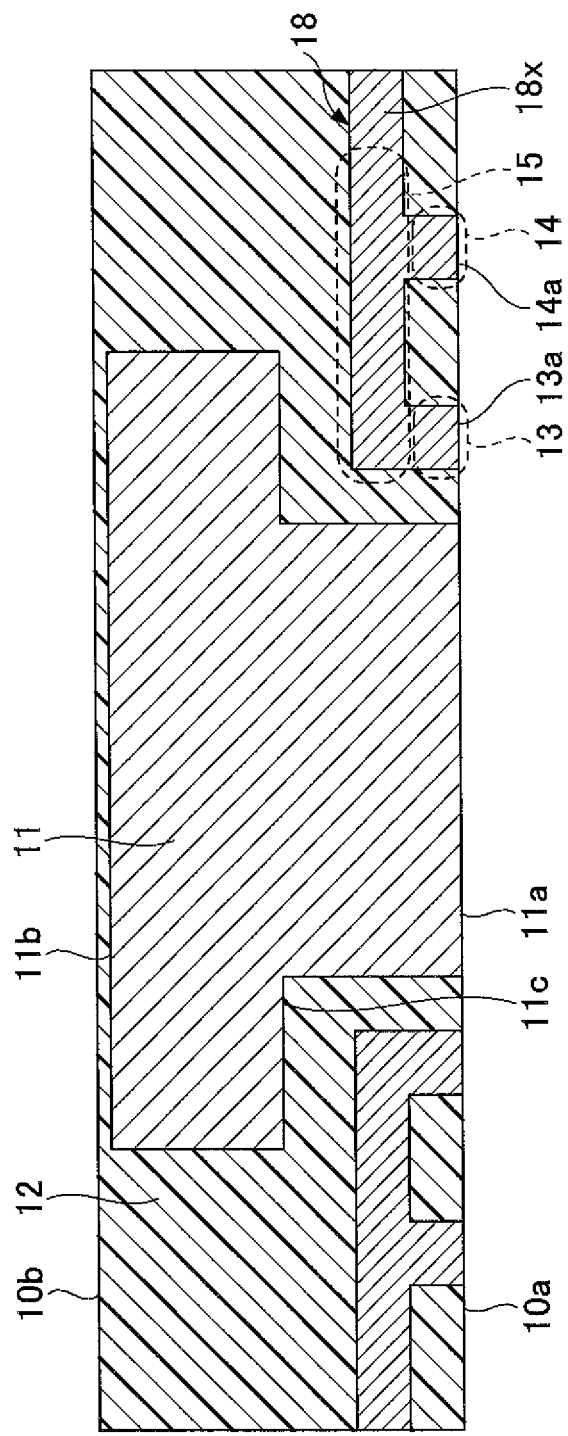
FIG. 9 is a diagram showing the manufacturing method of the wiring substrate of the first embodiment.

Subsequently, in the step illustrated in FIG. 9, the supporting body 19 is removed. For example, the supporting body 19 may be removed by mechanically separating the supporting body 19.

Figure 10:
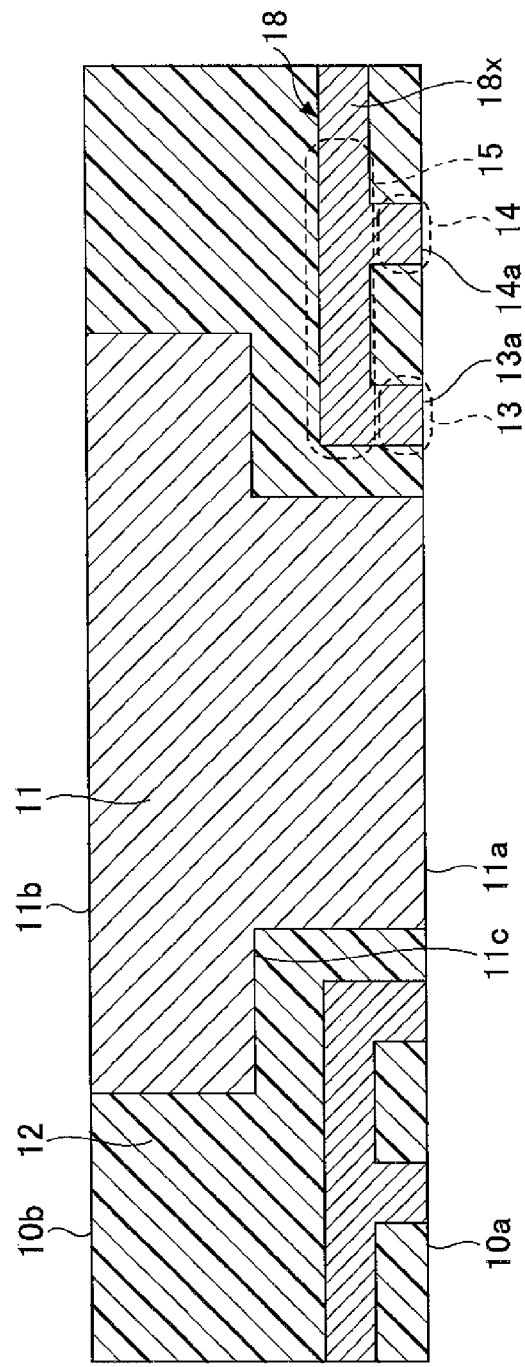
FIG. 10 is a diagram showing the manufacturing method of the wiring substrate of the first embodiment.

Subsequently, in the step illustrated in FIG. 10, the thin film of the encapsulation resin 12 formed on the second surface 11b of the heat sink 11 is removed. As an example of the removing method, mechanical polishing, abrasive blasting, plasma ashing, etc. may be used. When no thin film of the encapsulation resin 12 is formed on the second surface 11b of the heat sink 11 in the step of FIG. 8, it is unnecessary to perform the step of FIG. 10.

Figure 8:
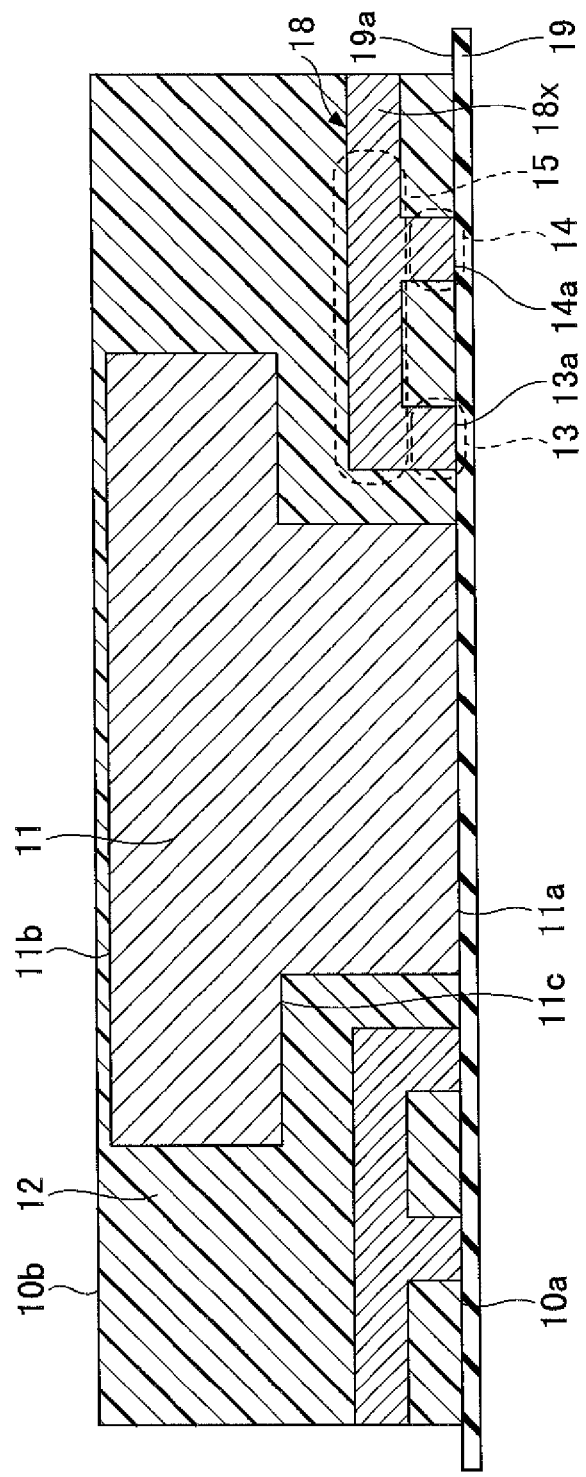
FIG. 8 is a diagram showing the manufacturing method of the wiring substrate of the first embodiment.

On the other hand, when a thin film of the encapsulation resin 12 is formed on the first surface 11a of the heat sink 11 in the step of FIG. 8, it is necessary to remove the thin film from the first surface 11a in the same method as the second surface 11b.

Figure 11:
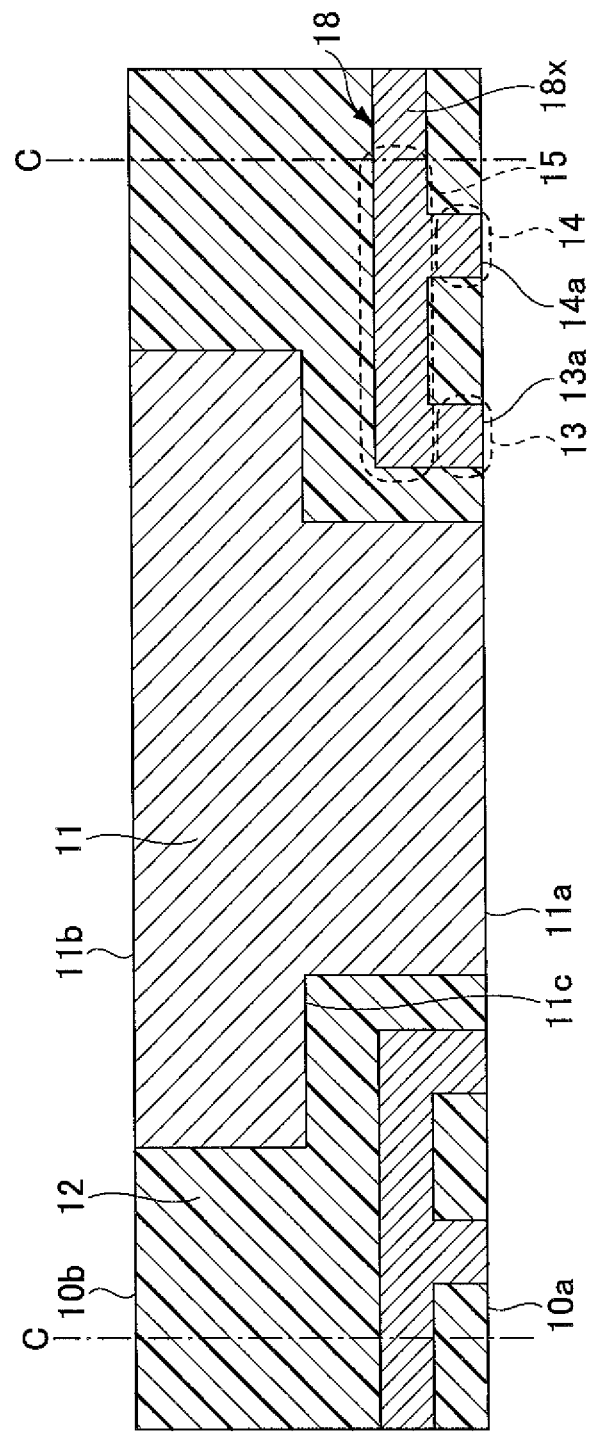
FIG. 11 is a diagram showing the manufacturing method of the wiring substrate of the first embodiment.

Subsequently, in the step illustrated in FIG. 11, the wiring substrate 10 as illustrated in FIGS. 1-3 is produced by cutting the structure illustrated in FIG. 10 at edge positions C indicated in FIG. 11. Cutting of the structure illustrated in FIG. 10 may be performed by a blade dicing process using a dicing blade, for example. The structure of FIG. 11 is illustrated as being the structure in which the wiring substrate 10 of FIG. 1 is turned upside down.

According to the first embodiment, a heat sink is covered by an encapsulation resin and a wiring substrate is manufactured. Hence, a heat sink having an appropriate thickness and shape as a result of consideration of a heating value of an electronic part can be provided, and a wiring substrate providing good heat dissipation can be produced. It is also possible to minimize the amount of the material of the heat sink, so that the material cost of the wiring substrate can be reduced.

According to the first embodiment, temporary fixing of the inner connection terminal, the outer connection terminal, and the heat sink is performed so that the end face of the inner connection terminal and the end face of the outer connection terminal, after the half etching is performed, and the first surface of the heat sink are in contact with one surface of the supporting body, these elements are covered by the encapsulation resin, and the supporting body is removed. As a result, the end face of the inner connection terminal, the end face of the outer connection terminal, and the first surface of the heat sink are flush with and exposed from the encapsulation resin to the first principal surface 10a. In other words, only the necessary parts of the heat sink, the inner connection terminal, and the outer connection terminal are exposed from the encapsulation resin, and other portions of these elements are covered by the encapsulation resin. It is possible to improve the reliability of insulation. The unnecessary conductive parts are not exposed, there is no need to provide a solder resist layer on the encapsulation resin, and the structure and the manufacturing method of the wiring substrate can be simplified and the manufacture cost of the wiring substrate can be reduced.

Next, some modifications of the first embodiment will be described. In a first modification of the first embodiment, an example of the wiring substrate in which a slit (a cross-shaped groove 11x) is formed in the first surface 11a of the heat sink 11 will be illustrated.

In the first modification of the first embodiment, the elements which are the same as corresponding elements in the foregoing embodiment are designated by the same reference numerals and a description thereof will be omitted.

Figure 12:
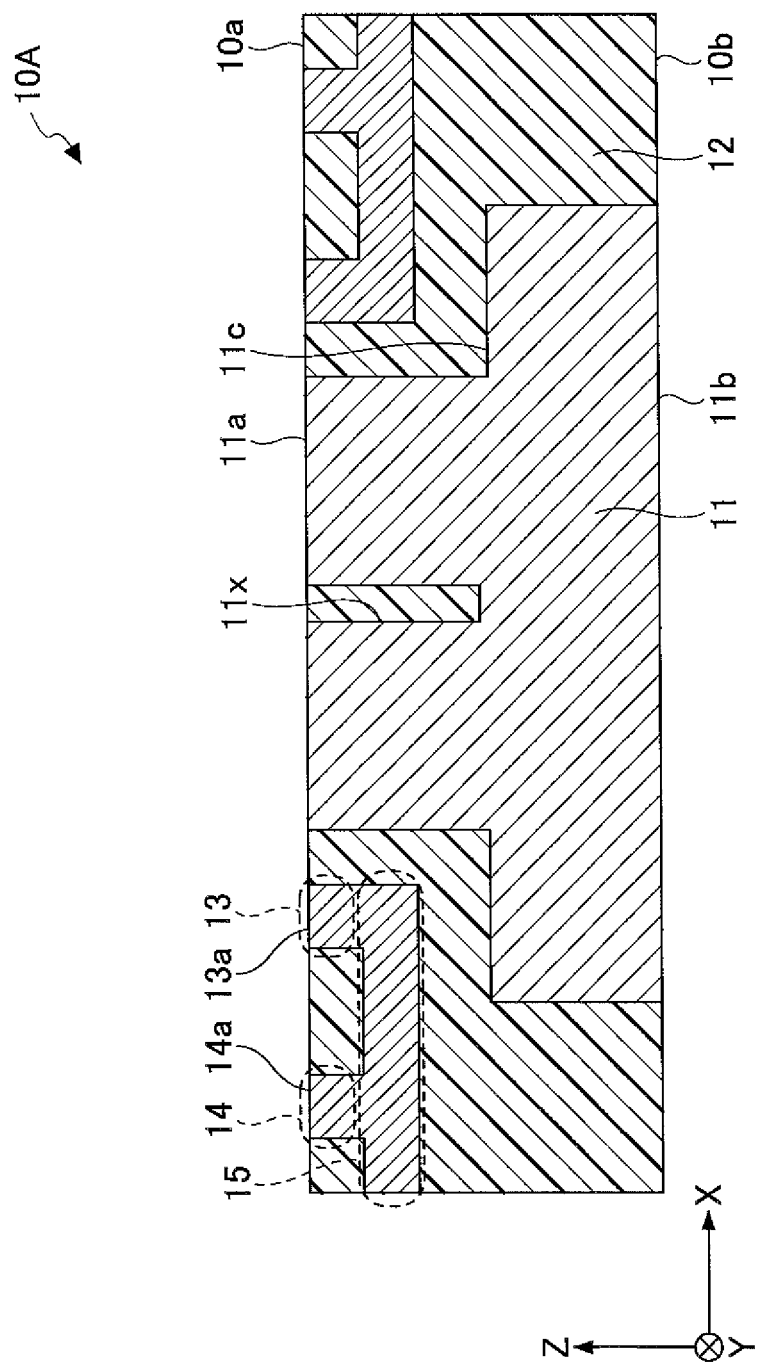
FIG. 12 is a cross-sectional view of a wiring substrate of a first modification of the first embodiment.
Figure 13:
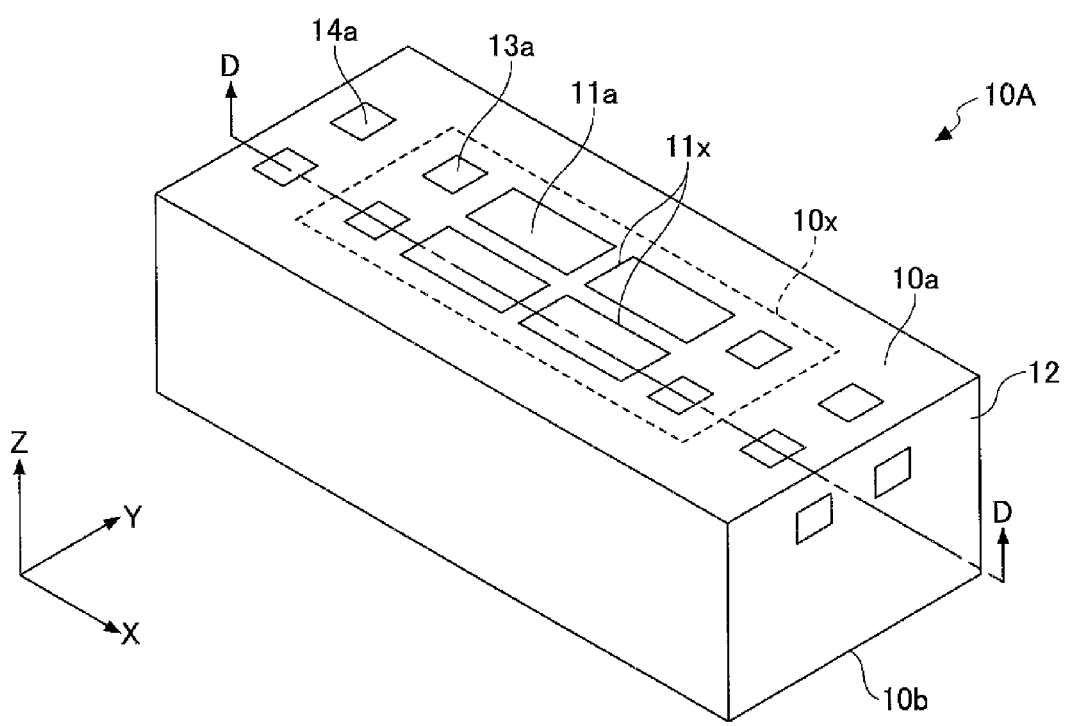
FIG. 13 is a perspective view showing a top surface of the wiring substrate of the first modification of the first embodiment.

FIG. 12 is a cross-sectional view of a wiring substrate of the first modification of the first embodiment. FIG. 13 is a perspective view showing a top surface of the wiring substrate of the first modification of the first embodiment.

A bottom surface of the wiring substrate of the first modification of the first embodiment is the same as that illustrated in FIG. 3, and an illustration thereof is omitted. FIG. 12 is a cross-sectional view of the wiring substrate taken along the line D-D indicated in FIG. 13.

As illustrated in FIGS. 12 and 13, the wiring substrate 10A of the first modification of the first embodiment differs from the wiring substrate 10 of the first embodiment (FIGS. 1-3) in that a cross-shaped groove 11x (when viewed from the vertical direction Z indicated in FIG. 12) is formed in the first surface 11a of the heat sink 11. The internal space in the groove 11x is filled with the encapsulation resin 12.

The groove 11x is formed in order to prevent occurrence of curvature or distortion of the heat sink 11 and cracks in the connection areas (solder) of the electronic part and the heat sink 11 due to a difference between a coefficient of linear expansion of the electronic part mounted in the electronic part loading area 10x of the wiring substrate 10A and a coefficient of linear expansion of the heat sink 11. A width of the groove 11x may be in a range of 50-500 micrometers, for example. A depth of the groove 11x may be on the order of 1-2 mm, for example. The groove 11x may be formed by a blade dicing process using a dicing blade, cutting, etching, die molding, etc.

The shape of the groove 11x is not limited to a cross shape in the plan view. The groove 11x may be formed to have an arbitrary shape in the plan view. For example, a plurality of grooves may be formed into a configuration in which the grooves are arranged side by side.

When heat is generated in an electronic part mounted in the electronic part loading area 10x of the wiring substrate 10A, the heat is transferred to the heat sink 11. Because the groove 11x is formed in the first surface 11a of the heat sink 11, the portion of the first surface 11a is more easily deformed by the heat than the step portion 11c of the heat sink 11. Hence, the difference in the behavior due to the difference between the coefficient of linear expansion of the electronic part mounted in the electronic part loading area 10x of the wiring substrate 10A and the coefficient of linear expansion of the heat sink 11 may be absorbed.

A coefficient of linear expansion of the electronic part when the electronic part mounted in electronic part loading area 10x of the wiring substrate 10A contains silicon (Si) as the main ingredient may be on the order of 3 ppm/degree C. A coefficient of linear expansion of the electronic part when the electronic part is a ceramic substrate which contains alumina ($Al_2O_3$) as the main ingredient may be on the order of 8 ppm/degree C. On the other hand, a coefficient of linear expansion of the heat sink 11 when the heat sink 11 contains copper (Cu) as the main ingredient may be on the order of 17 ppm/degree C. A coefficient of linear expansion of the heat sink 11 when the heat sink 11 contains aluminum (Al) as the main ingredient may be on the order of 23 ppm/degree C.

According to the first modification of the first embodiment, the advantages which are the same as those of the first embodiment may be provided. Moreover, according to the first modification of the first embodiment, a slit (a cross-shaped groove) is formed in a first surface of a heat sink, and it is possible to prevent occurrence of curvature or distortion of the heat sink and cracks in the connection areas (solder) of the electronic part and the heat sink due to a difference between a coefficient of linear expansion of the electronic part mounted in the electronic part loading area of the wiring substrate and a coefficient of linear expansion of the heat sink.

Next, a second modification of the first embodiment will be described. In the second modification of the first embodiment, an example in which a slit (a cross-shaped groove 11y) which is different from the slit in the first modification of the first embodiment is formed in the first surface 11a of the heat sink 11.

In the second modification of the first embodiment, the elements which are the same as corresponding elements in the foregoing embodiment and modification are designated by the same reference numerals and a description thereof will be omitted.

Figure 14:
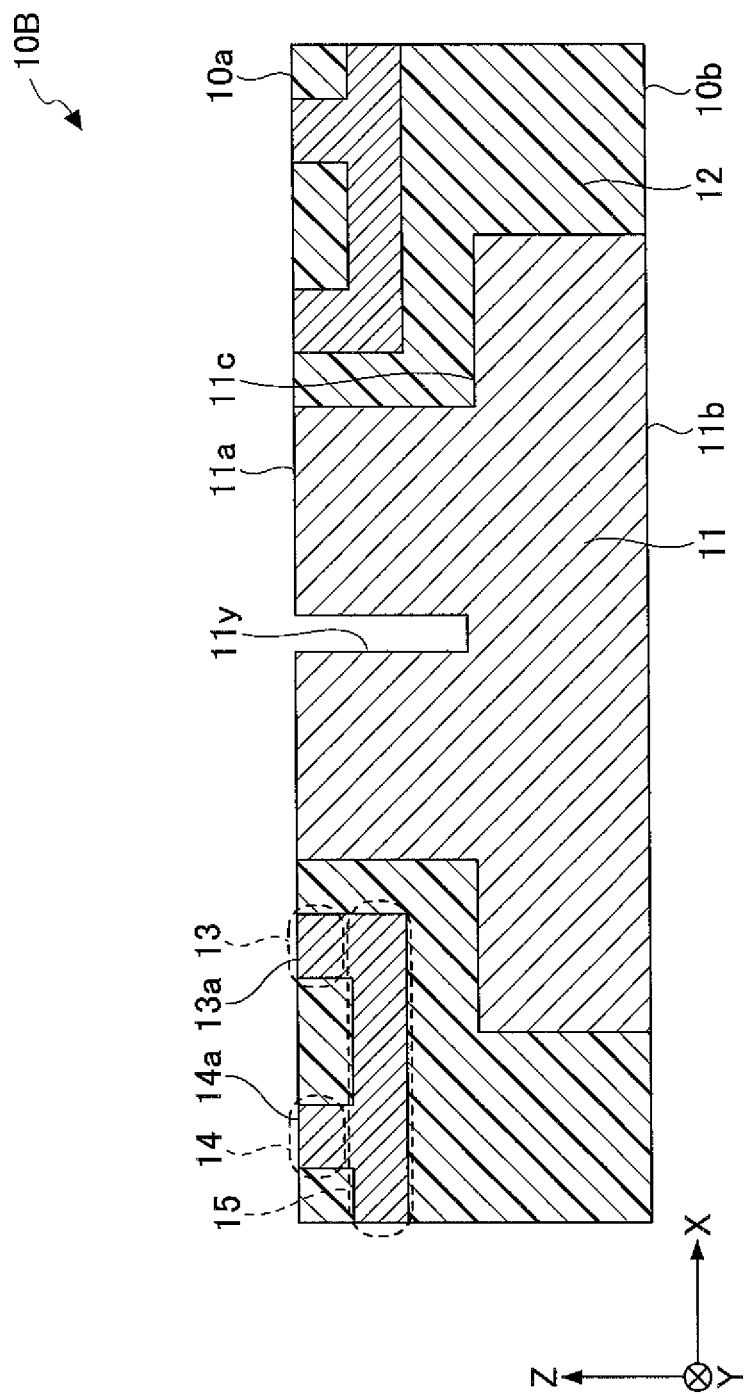
FIG. 14 is a cross-sectional view of a wiring substrate of a second modification of the first embodiment.
Figure 15:
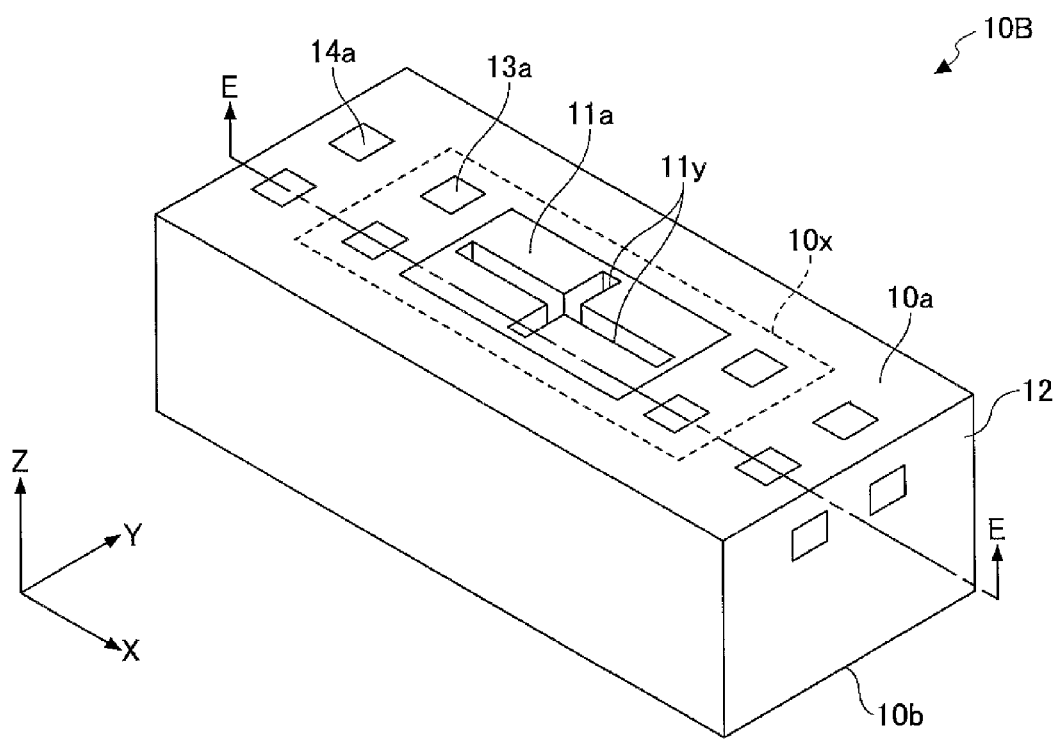
FIG. 15 is a perspective view showing a top surface of the wiring substrate of the second modification of the first embodiment.

FIG. 14 is a cross-sectional view of a wiring substrate of the second modification of the first embodiment. FIG. 15 is a perspective view showing a top surface of the wiring substrate of the second modification of the first embodiment.

A bottom surface of the wiring substrate of the second modification of the first embodiment is the same as that illustrated in FIG. 3, and an illustration thereof is omitted. FIG. 14 is a cross-sectional view of the wiring substrate taken along the line E-E indicated in FIG. 15.

As illustrated in FIGS. 14 and 15, the wiring substrate 10B of the second modification of the first embodiment differs from the wiring substrate 10A of the first modification of the first embodiment (FIGS. 12 and 13) in that a cross-shaped groove 11y in the plan view is formed in the first surface 11a of the heat sink 11. The groove 11y of the second modification differs from the groove 11x (FIGS. 12 and 13) in that the groove 11y is not exposed to the side surfaces of the heat sink 11 and the internal space in the groove 11y is not filled with the encapsulation resin 12. In other words, the groove 11y is a cavity.

The groove 11y is formed in order to prevent occurrence of curvature or distortion of the heat sink 11 and cracks in the connection areas (solder) of the electronic part and the heat sink 11 due to a difference between a coefficient of linear expansion of the electronic part mounted in the electronic part loading area 10x of the wiring substrate 10B and a coefficient of linear expansion of the heat sink 11. A width of the groove 11y may be in a range of 50-500 micrometers, for example. A depth of the groove 11y may be on the order of 1-2 mm, for example. The groove 11y may be formed by a blade dicing process using a dicing blade, cutting, etching, die molding, etc.

The shape of the groove 11y is not limited to a cross shape in the plan view. The groove 11y may be formed to have an arbitrary shape in the plan view. For example, a plurality of grooves may be formed into a configuration in which the grooves are arranged side by side.

When heat is generated in an electronic part mounted in the electronic part loading area 10x of the wiring substrate 10B, the heat is transferred to the heat sink 11. Because the groove 11y is formed in the first surface 11a of the heat sink 11, the portion of the first surface 11a is more easily deformed by the heat than the step portion 11c of the heat sink 11. At this time, the groove 11y the internal space of which is a cavity is much more easily deformed than the groove 11x the internal space of which is filled with the encapsulation resin 12. Hence, the difference in the behavior due to the difference between the coefficient of linear expansion of the electronic part mounted in electronic part loading area 10x of the wiring substrate 10B and the coefficient of linear expansion of the heat sink 11 can be more easily absorbed than the wiring substrate 10A.

According to the second modification of the first embodiment, the advantages which are the same as those of the first embodiment may be provided. Moreover, according to the second modification of the first embodiment, a hollow slit (a cross-shaped hollow groove) is formed in a first surface of a heat sink, and it is possible to more efficiently prevent occurrence of curvature or distortion of the heat sink and cracks in the connection areas (solder) of the electronic part and the heat sink due to a difference between a coefficient of linear expansion of the electronic part and a coefficient of linear expansion of the heat sink than in the case of the first modification of the first embodiment.

Next, a second embodiment of the present disclosure will be described. In the second embodiment, a wiring substrate in which a plurality of electronic parts can be mounted thereon is illustrated.

In the second embodiment, the elements which are the same as corresponding elements in the foregoing embodiment and modifications are designated by the same reference numerals and a description thereof will be omitted.

Figure 16:
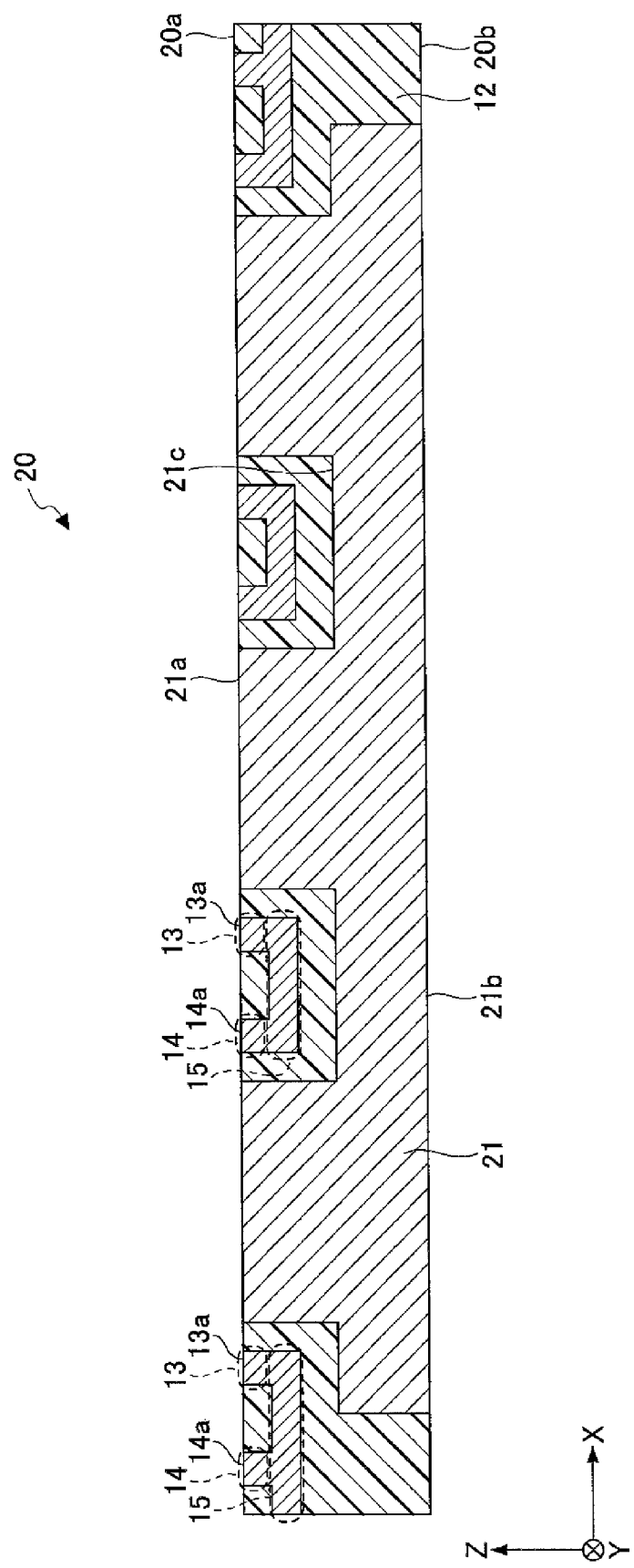
FIG. 16 is a cross-sectional view of a wiring substrate of a second embodiment of the present disclosure.
Figure 17:
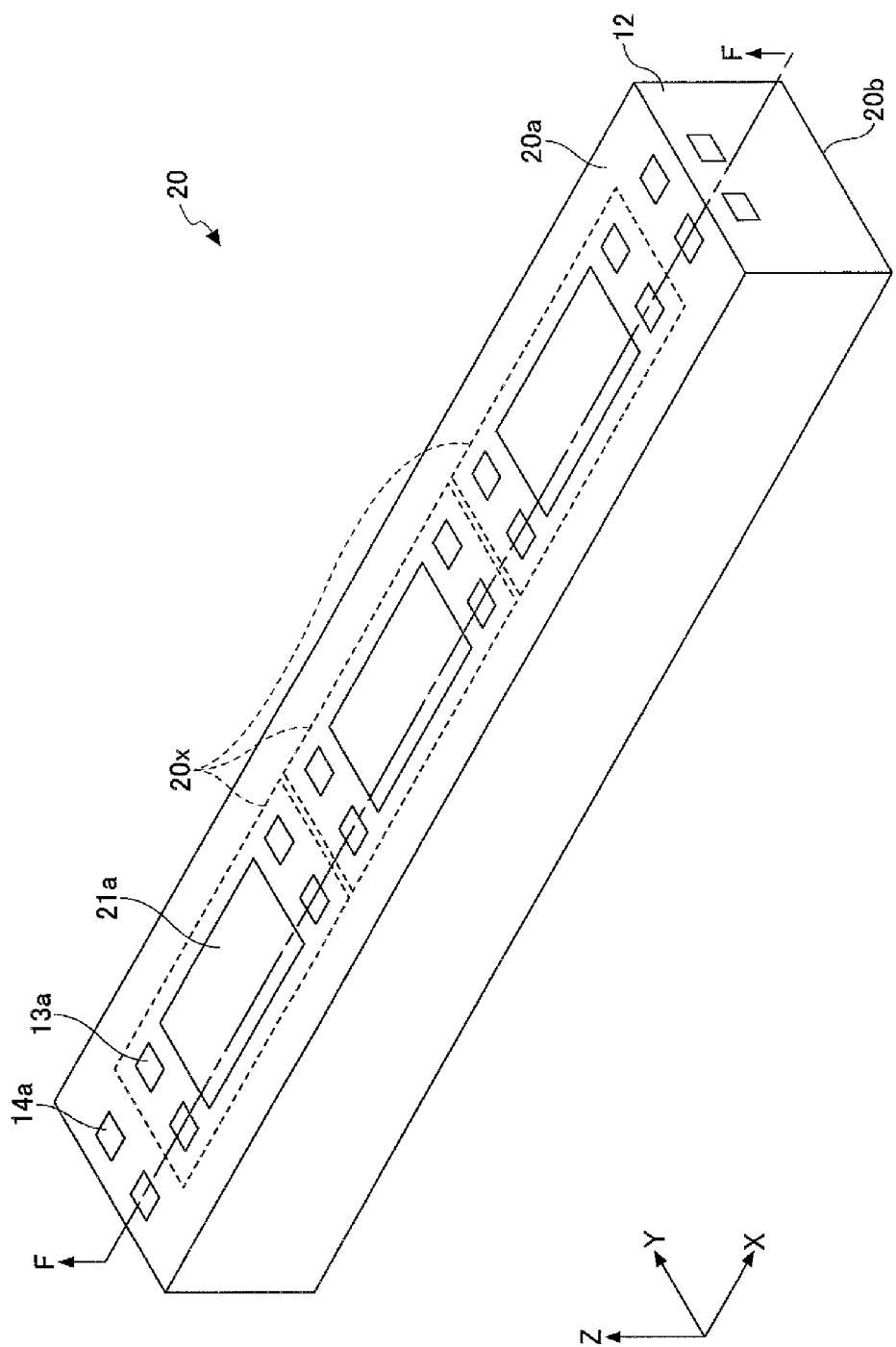
FIG. 17 is a perspective view showing a top surface of the wiring substrate of the second embodiment.
Figure 18:
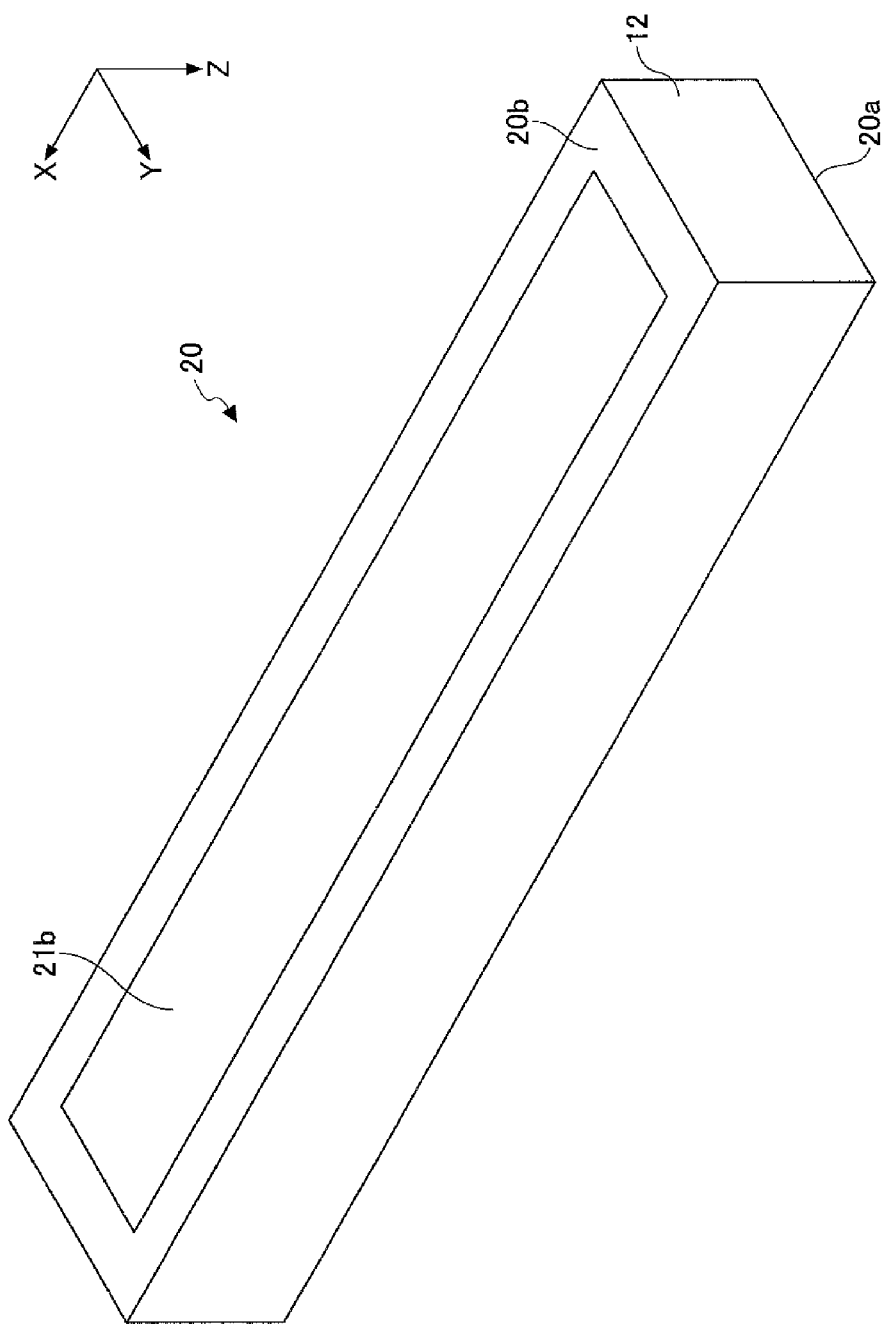
FIG. 18 is a perspective view showing a bottom surface of the wiring substrate of the second embodiment.

FIG. 16 is a cross-sectional view of a wiring substrate of the second embodiment. FIG. 17 is a perspective view showing a top surface of the wiring substrate of the second embodiment. FIG. 18 is a perspective view showing a bottom surface of the wiring substrate of the second embodiment. FIG. 16 is a cross-sectional view of the wiring substrate taken along the line F-F indicated in FIG. 17.

As illustrated in FIGS. 16-18, the heat sink 11 in the foregoing embodiment and modifications is replaced by a heat sink 21, and the wiring substrate 20 of the second embodiment differs from the wiring substrate 10 of the first embodiment (FIGS. 1-3) in that a plurality of electronic parts can be mounted on the wiring substrate 20.

Reference numeral 20a denotes a first principal surface (which will be referred to as a first principal surface 20a) of the wiring substrate 20, and reference numeral 20b denotes a second principal surface (which will be referred to as a second principal surface 20b) of the wiring substrate 20. The first principal surface 20a is a surface on which a plurality of electronic parts are mounted. Reference numeral 20x denotes one of a plurality of electronic part loading areas in which the plurality of electronic parts are respectively mounted.

The heat sink 21 provides a function that dissipates outside the heat generated in the plurality of electronic parts (in this embodiment, three electronic parts) mounted in the electronic part loading areas 20x on the first principal surface 20a of the wiring substrate 20. A first surface 21a of the heat sink 21 is divided to have a number of division areas corresponding to the number of electronic parts mounted, and each division area is exposed to one of the electronic part loading areas 20x.

A second surface 21b of the heat sink 21 is exposed to the second principal surface 20b of the wiring substrate 20. However, the second surface 21b is not divided like the first surface 21a, and provides a common surface to the plurality of electronic parts being mounted. In other words, instead of providing a plurality of heat sinks 21 for the plurality of electronic parts mounted in the plurality of electronic part loading areas 20x respectively, a single heat sink 21 is provided in common for the plurality of electronic parts mounted.

The heat sink 21 has a plurality of step portions 21c, and each step portion 21c is formed along the circumference of each of the division areas of the first surface 21a when viewed from a vertical direction Z in FIG. 16. With the second surface 21b of the heat sink 21, the heat generated in the electronic parts mounted in the electronic part loading areas 20x of the wiring substrate 20 can be efficiently radiated to the side of the second principal surface 20b. The material of the heat sink 21 and the finishing of the exposed surface of the heat sink 21 may be the same as those of the heat sink 11 in the foregoing embodiment.

In the respective electronic part loading areas 20x, the end faces 13a of the inner connection terminals 13 are arranged on the first surface 21a adjacent to each other in the direction X, and each end face 13a is a portion electrically connected to an electrode terminal of an electronic part mounted in the electronic part loading area 20x. In this embodiment, the electronic parts mounted in the electronic part loading areas 20x are connected in series, and the end faces 14a of the outer connection terminals 14 are arranged at the outer peripheral edges of the first principal surface 20a of the wiring substrate 20a and provided for inputting and outputting of signals from and to an external device.

In each electronic part loading area 20x, the inner connection terminal 13, the outer connection terminal 14, and the wiring 15 are formed integrally. The first surface 21a of the heat sink 21, the end face 13a of the inner connection terminal 13, and the end face 14a of outer connection terminal 14 are flush with the first principal surface 20a of the wiring substrate 20a. In other words, the division areas of the first surface 21a of the heat sink 21, the end faces 13a of the inner connection terminals 13, and the end faces 14a of the outer connection terminals 14 are exposed from the encapsulation resin 12 to the first principal surface 20a and flush with the first principal surface 20a. The wiring substrate 20 may be produced by the same manufacturing method as the wiring substrate 10.

According to the second embodiment, the same advantages as those of the first embodiment may be provided. Moreover, according to the second embodiment, it is possible to provide a wiring substrate in which a first surface of a heat sink is formed to include a number of division areas exposed to a first principal surface of the wiring substrate, the number of division areas corresponding to a number of electronic part loading areas in which a corresponding number of electronic parts can be mounted on the first principal surface.

Next, some modifications of the second embodiment will be described. Illustrated in the second embodiment is an example of the wiring substrate in which a single heat sink is arranged and a first surface of the heat sink is formed to include a number of division areas exposed to a first principal surface of the wiring substrate, the number of division areas corresponding to a number of electronic part loading areas in which a corresponding number of electronic parts can be mounted on the first principal surface.

In a first modification of the second embodiment, an example of the wiring substrate in which a plurality of heat sinks are arranged, respective first surfaces of the heat sinks are exposed to a first principal surface of the wiring substrate, and the first surfaces of the heat sinks correspond to a number of electronic part loading areas in which a corresponding number of electronic parts can be mounted on the first principal surface will be illustrated.

In the first modification of the second embodiment, the elements which are the same as corresponding elements in the second embodiment are designated by the same reference numerals and a description thereof will be omitted.

Figure 19:
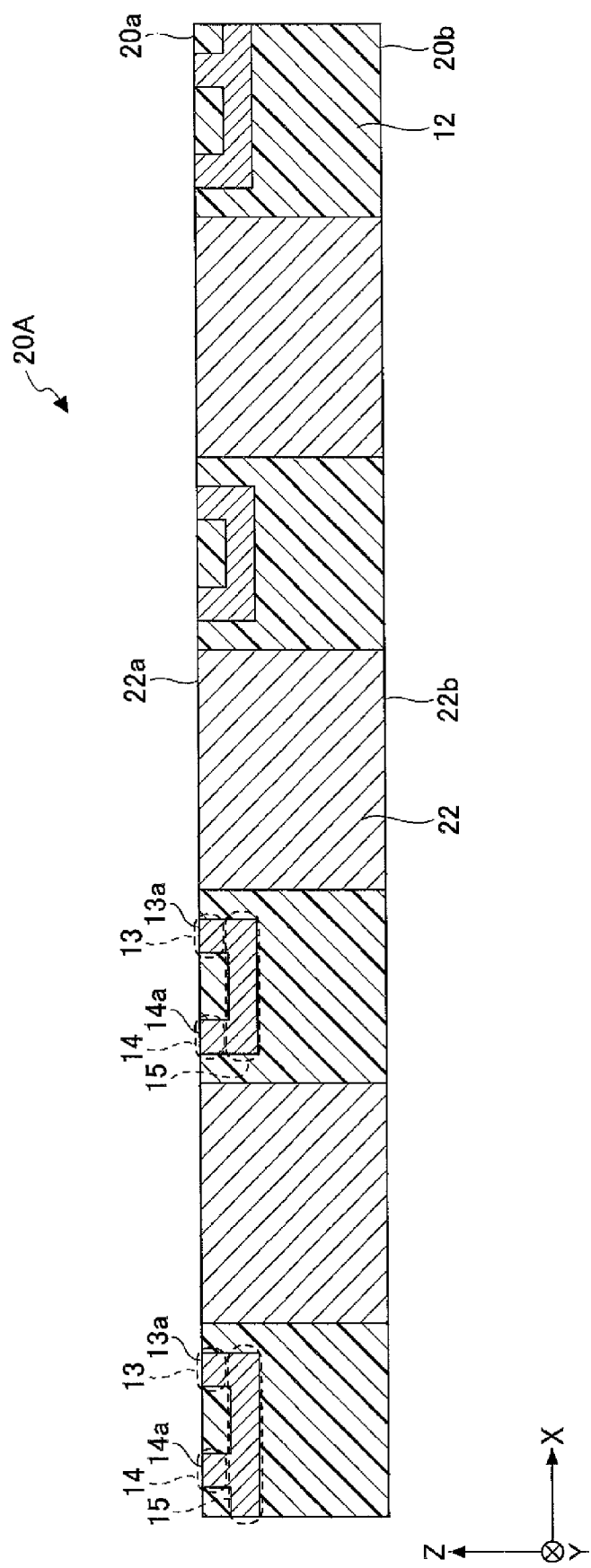
FIG. 19 is a cross-sectional view of a wiring substrate of a first modification of the second embodiment.

FIG. 19 is a cross-sectional view of a wiring substrate of the first modification of the second embodiment. As illustrated in FIG. 19, the wiring substrate 20A of the first modification of the second embodiment differs from the wiring substrate 20 of the second embodiment (FIGS. 16-18) in that the heat sink 21 in the second embodiment is replaced by a plurality of heat sinks 22.

A plurality of electronic part loading areas are formed on the first principal surface 20a of the wiring substrate 20A. The plurality of heat sinks 22 have respective first surfaces 22a corresponding to a plurality of electronic parts mounted in the plurality of electronic part loading areas on the first principal surface 20a respectively. Each heat sink 22 has a function which dissipates outside the heat generated in a corresponding one of the electronic parts (in this case, three electronic parts).

The first surface 22a of each heat sink 22 is exposed to one of the plurality of electronic part loading areas on the first principal surface 20a. The second surface 22b of each heat sink 22 is exposed to the second principal surface 20b of the wiring substrate 20A.

According to the first modification of the second embodiment, the same advantages as the second embodiment may be provided. Moreover, according to the first modification of the second embodiment, it is possible to provide a wiring substrate on which a plurality of electronic parts can be mounted, wherein a plurality of heat sinks are arranged and first surfaces of the heat sinks provide electronic part loading areas in which the plurality of electronic parts are mounted respectively. Each heat sink 22 in the first modification of the second embodiment does not have a step portion. Alternatively, each heat sink 22 may be formed to include a step portion similar to the heat sink 11 of the first embodiment (FIG. 1).

Next, a second modification of the second embodiment will be described. Illustrated in the second embodiment and the foregoing modification is an example of the wiring substrate in which the electronic parts mounted have an identical configuration. In a second modification of the second embodiment, an example of the wiring substrate in which the electronic parts mounted have different configurations will be described.

In the second modification of the second embodiment, the elements which are the same as corresponding elements in the second embodiment and the foregoing modification are designated by the same reference numerals and a description thereof will be omitted.

Figure 20:
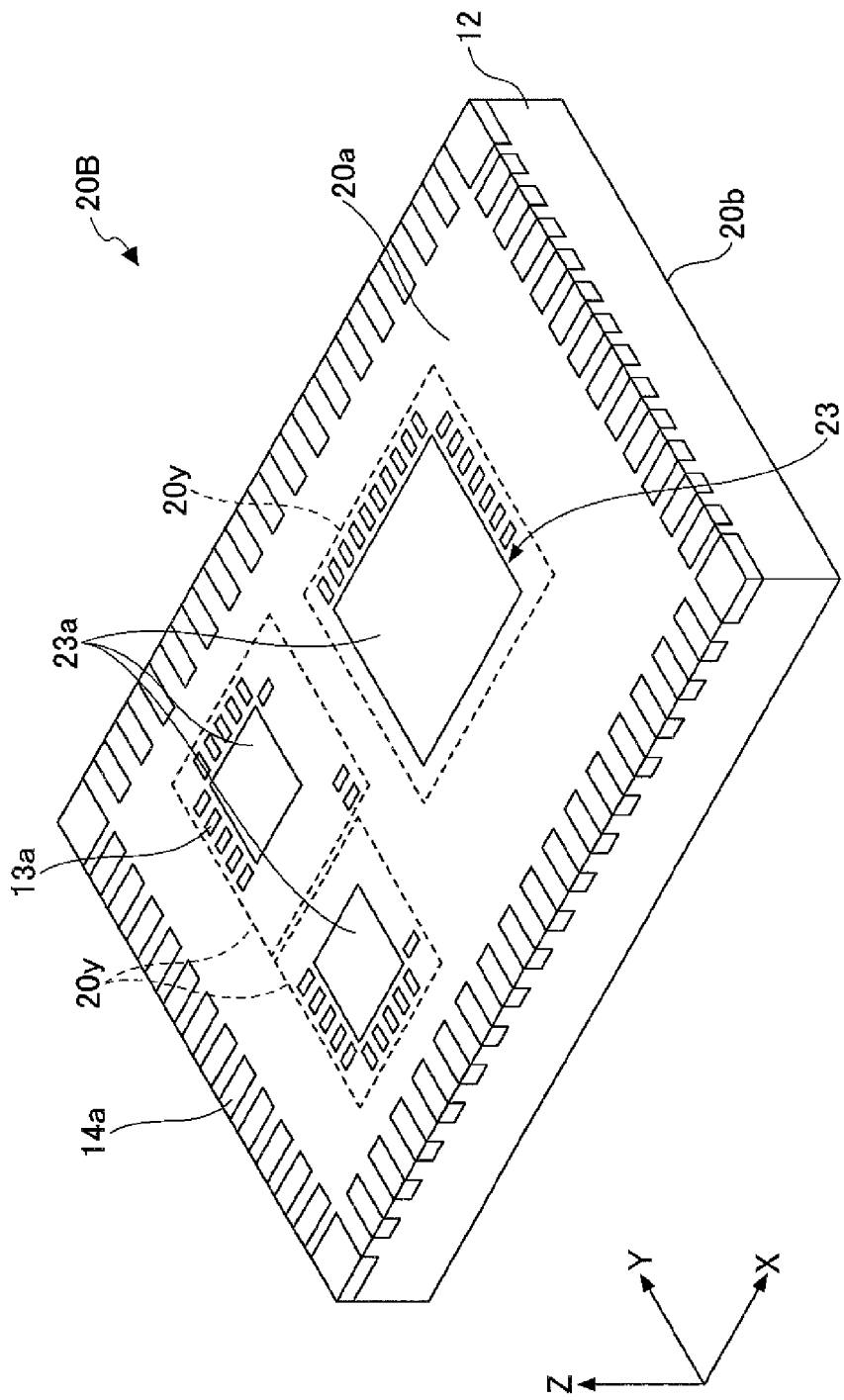
FIG. 20 is a perspective view showing a top surface of the wiring substrate of the second modification of the second embodiment.
Figure 21:
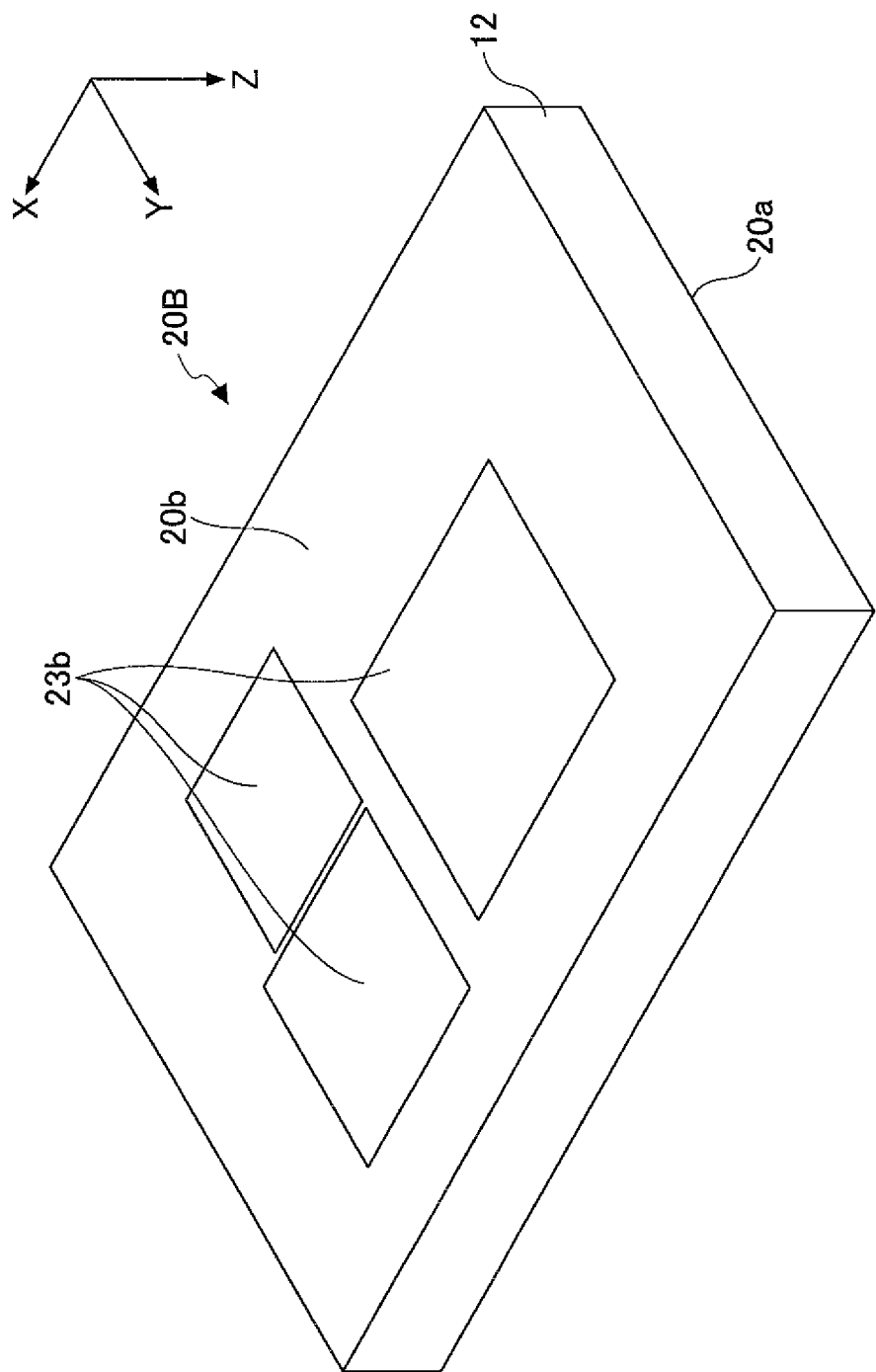
FIG. 21 is a perspective view showing a bottom surface of the wiring substrate of the second modification of the second embodiment.

FIG. 20 is a perspective view showing a top surface of a wiring substrate of the second modification of the second embodiment. FIG. 21 is a perspective view showing a bottom surface of the wiring substrate of the second modification of the second embodiment.

As illustrated in FIGS. 20 and 21, the wiring substrate 20B of the second modification of the second embodiment differs from the wiring substrate 20 of the second embodiment (FIGS. 16-18) and the wiring substrate 20A of the first modification of the second embodiment (FIG. 19) in that a plurality of heat sinks 23 having different configurations are arranged and the configurations of the heat sinks 23 respectively correspond to those of a plurality of electronic parts mounted on the first principal surface 20a of the wiring substrate 20B.

Each heat sink 23 has a function which dissipates outside the heat generated in a corresponding one of the electronic parts (in this case, three electronic parts) mounted in the electronic part loading areas 20y on the first principal surface 20a of the wiring substrate 20B.

The plurality of electronic part loading areas 20y are formed on the first principal surface 20a of the wiring substrate 20B. The plurality of heat sinks 23 have respective first surfaces 23a corresponding to the plurality of electronic parts mounted in the electronic part loading areas 20y. The first surface 23a of each heat sink 23 is exposed to one of the plurality of electronic part loading areas 20y on the first principal surface 20a. The second surface 23b of each heat sink 23 is exposed to the second principal surface 20b of the wiring substrate 20B. In other words, the heat sinks 23 are individually arranged so that the number of the heat sinks 23 and the configurations thereof correspond to the number and the configurations of the electronic parts mounted in the electronic part loading areas 20y.

As illustrated in FIGS. 20 and 21, the end face 14a of each outer connection terminal 14 is continuously exposed to both the first principal surface 20a and the side surface of the wiring substrate 20B at the outer peripheral edge of the wiring substrate 20B, and the encapsulation resin 12 covers the outer connection terminal 14 except the end face 14a. The end face 14a of each outer connection terminal 14 in the wiring substrate 20B is provided for inputting and outputting of signals from and to an external device.

According to the second modification of the second embodiment, the same advantages as the second embodiment may be provided. Moreover, according to the second modification of the second embodiment, it is possible to provide a wiring substrate on which a plurality of electronic parts can be mounted, wherein a number of heat sinks with different configurations are arranged corresponding to the number and the configurations of the electronic parts mounted.

Each heat sink 23 in the second modification of the second embodiment does not have a step portion. Alternatively, each heat sink 23 may be formed to include a step portion similar to the heat sink 11 of the first embodiment.

In the second modification of the second embodiment, the end face 14a of each outer connection terminal 14 is continuously exposed to both the first principal surface 20a and the side surface of the wiring substrate 20B at the outer peripheral edge of the wiring substrate 20B. Alternatively, the end face 14a of each outer connection terminal 14 may be exposed only to the first principal surface 20a of the wiring substrate 20B similar to that in the first embodiment (FIG. 2).

Next, a third embodiment of the present disclosure will be described. In the third embodiment, an example of the wiring substrate in which a heat sink having a multilayer structure is provided will be illustrated.

In the third embodiment, the elements which are the same as corresponding elements in the foregoing embodiments and modifications are designated by the same reference numerals and a description thereof will be omitted.

Figure 22:
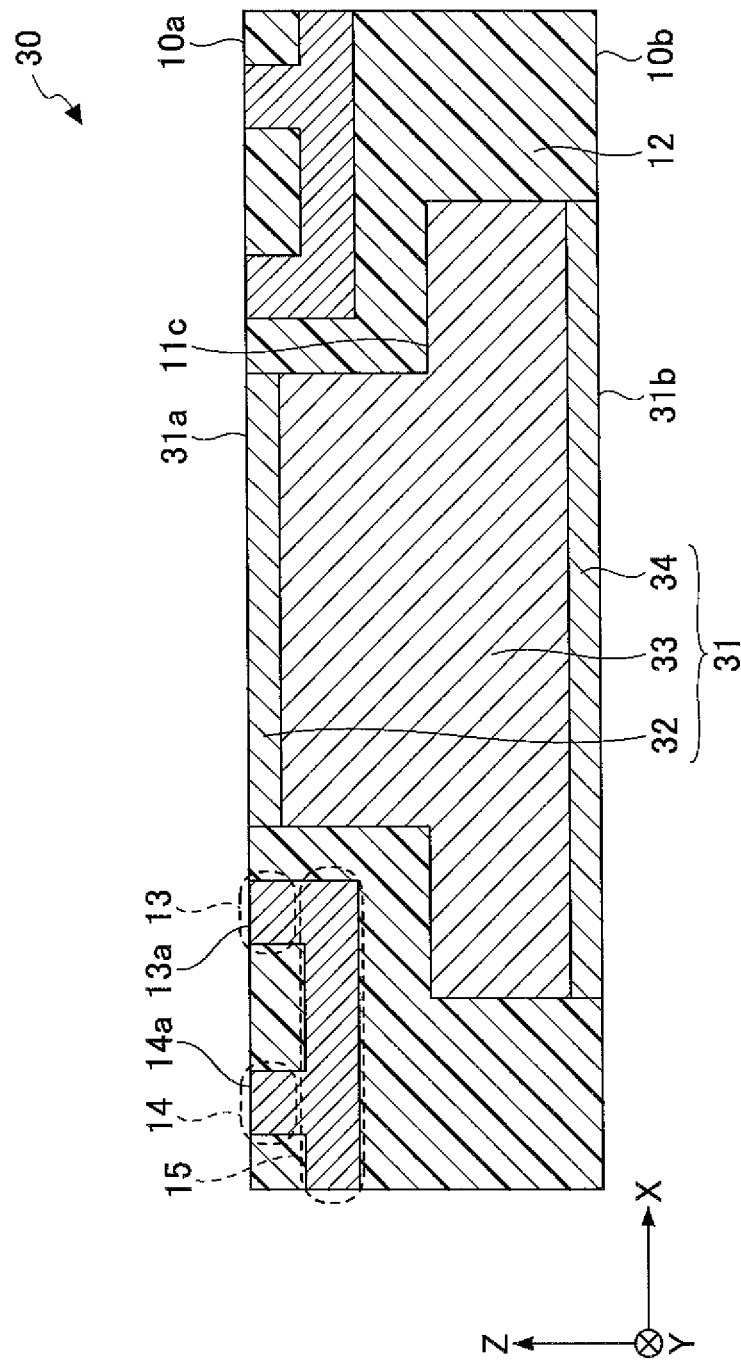
FIG. 22 is a cross-sectional view of a wiring substrate of a third embodiment of the present disclosure.

FIG. 22 is a cross-sectional view of a wiring substrate of the third embodiment. Top and bottom surfaces of the wiring substrate of the third embodiment are the same as those illustrated in FIG. 2 and FIG. 3, and an illustration thereof is omitted.

As illustrated in FIG. 22, the wiring substrate 30 of the third embodiment differs from the wiring substrate 10 of the first embodiment (FIGS. 1-3) in that the heat sink 11 in the first embodiment is replaced by a heat sink 31. In FIG. 22, reference numeral 31a denotes a first surface of the heat sink 31 (which will be referred to as a first surface 31a), and reference numeral 31b denotes a second surface of the heat sink 31 (which will be referred to as a second surface 31b).

The heat sink 31 is constructed to include a first layer 32, a second layer 33, and a third layer 34. The heat sink 31 may be produced by performing a die drawing process in which a cladding material is drawn through a die, for example. The cladding material is a composite material prepared by rolling sheet metal materials with different characteristics into a single sheet. In the heat sink 31, for example, copper (Cu), etc. may be used as a material of each of the first layer 32 and the third layer 34. As a material of the second layer 33, for example, aluminum (Al), etc. may be used.

For example, when a total thickness of the heat sink 31 is on the order of 2 mm, a thickness of the first layer 32 may be on the order of 0.3 mm, a thickness of the second layer 33 may be on the order of 1.4 mm, and a thickness of the third layer 34 may be on the order of 0.3 mm.

For example, if the heat sink 31 is made of aluminum (Al) only and an Ni/Au layer (or a metal layer in which a nickel layer and a gold layer are laminated in this order) is plated on each of the first surface 31a and the second surface 31b by an electrolysis electroplating process, a problem that the aluminum (Al) of the heat sink is corroded may arise. On the other hand, if the heat sink 31 is made of copper (Cu) only and an Ni/Au layer is plated on each of the first surface 31a and the second surface 31b, the problem in the case of aluminum (Al) does not arise because copper (Cu) has a corrosion resistance is higher than that of aluminum (Al). However, a specific gravity of copper (Cu) is larger than a specific gravity of aluminum (Al).

To eliminate the above problem, the heat sink 31 is formed to have a multilayer structure. For example, the second layer 33 is made of aluminum (Al) and the first layer 32 and the third layer 34 are made of copper (Cu). In the third embodiment, copper (Cu) having a corrosion resistance higher than that of aluminum (Al) is plated to the first surface 31a and the second surface 31b, and the first surface 31a and the second surface 31b which are exposed from the encapsulation resin 12 can be protected from corrosion. The major portion of the heat sink 31 is made of aluminum (Al) having a specific gravity smaller than that of copper (Cu), and it is possible to provide a better weight reduction effect than in the case in which the heat sink 31 is made of copper (Cu) only.

According to the third embodiment, the advantages which are the same as those of the first embodiment may be provided. Moreover, according to the third embodiment, a heat sink having a multilayer structure is arranged, a metal material with a corrosion resistance higher than that of an internal layer of the heat sink is used for an outermost layer of the heat sink (the layer exposed from the encapsulation resin), and it is possible to improve the ease of the handling, such as plating. Moreover, according to the third embodiment, the internal layer which occupies the major portion of the heat sink is made of a metal material having a specific gravity smaller than that of a metal material of the outermost layer (the layer exposed from the encapsulation resin), and it is possible to provide a good weight reduction effect for the heat sink.

The multilayer heat sink of the third embodiment may be applied to other embodiments and modifications. The heat sink of the third embodiment may be formed to have a multilayer structure including four or more layers.

Next, a fourth embodiment of the present disclosure will be described. In the fourth embodiment, an example of an electronic device in which a semiconductor package as an example of the electronic part is mounted on the wiring substrate of the first embodiment will be illustrated.

In the fourth embodiment, the elements which are the same as corresponding elements in the foregoing embodiments and modifications are designated by the same reference numerals and a description thereof will be omitted.

Figure 23:
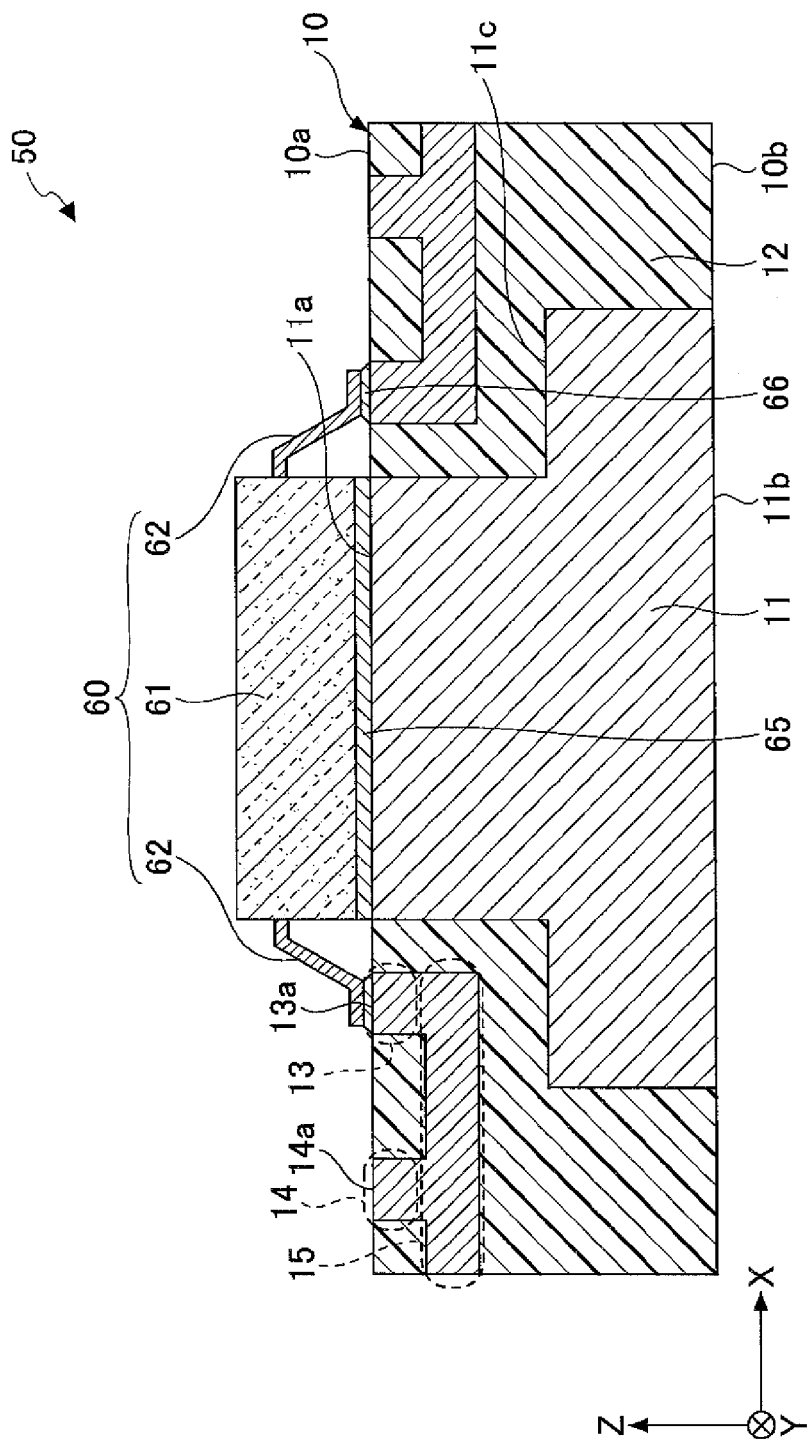
FIG. 23 is a cross-sectional view of an electronic device of a fourth embodiment of the present disclosure.

FIG. 23 is a cross-sectional view of an electronic device of the fourth embodiment. As illustrated in FIG. 23, the electronic device 50 of the fourth embodiment is arranged so that a semiconductor package 60 is mounted in the electronic part loading area of the first principal surface 10a of the wiring substrate 10.

The semiconductor package 60 is constructed to include an encapsulation resin 61 and a lead 62. An semiconductor chip (not shown) is enclosed in the encapsulation resin 61. A bottom surface of the encapsulation resin 61 is bonded via an adhesion layer 65 to the first surface 11a of the heat sink 11 of the wiring substrate 10. One end of the lead 62 is electrically connected to the semiconductor chip (not shown) within the encapsulation resin 61, and the other end of the lead 62 is exposed from the encapsulation resin 61 and electrically connected to the end face 13a of the inner connection terminal 13 of the wiring substrate 10 via a conductive part 66.

As a material of the encapsulation resin 61, for example, the same material as the encapsulation resin 12 may be used. As a material of the lead 62, copper (Cu), 42 alloy (an alloy of iron (Fe) and nickel (Ni)), etc. may be used. It is preferred to use a material with a sufficient thermal conductivity as a material of the adhesion layer 65. As a material of the adhesion layer 65, for example, solder, silver paste, etc. may be used. Alternatively, a non-conductive material may be used as the material of the adhesion layer 65. As a material of the conductive part 66, a conductive material, such as solder and silver paste, may be used.

According to the fourth embodiment, the semiconductor package is mounted on the wiring substrate of the first embodiment, and it is possible to provide an electronic device which provides good heat dissipation nature with a low price.

Next, some modifications of the fourth embodiment will be described. Illustrated in the fourth embodiment is an example of the electronic device in which a semiconductor package as an example of an electronic part is mounted on the wiring substrate of the first embodiment. In a first modification of the fourth embodiment, an example of the electronic device in which a semiconductor chip (bare chip) as an example of an electronic part is mounted on the wiring substrate of the first embodiment will be described.

In the first modification of the fourth embodiment, the elements which are the same as corresponding elements in the foregoing embodiments and modifications are designated by the same reference numerals and a description thereof will be omitted.

Figure 24:
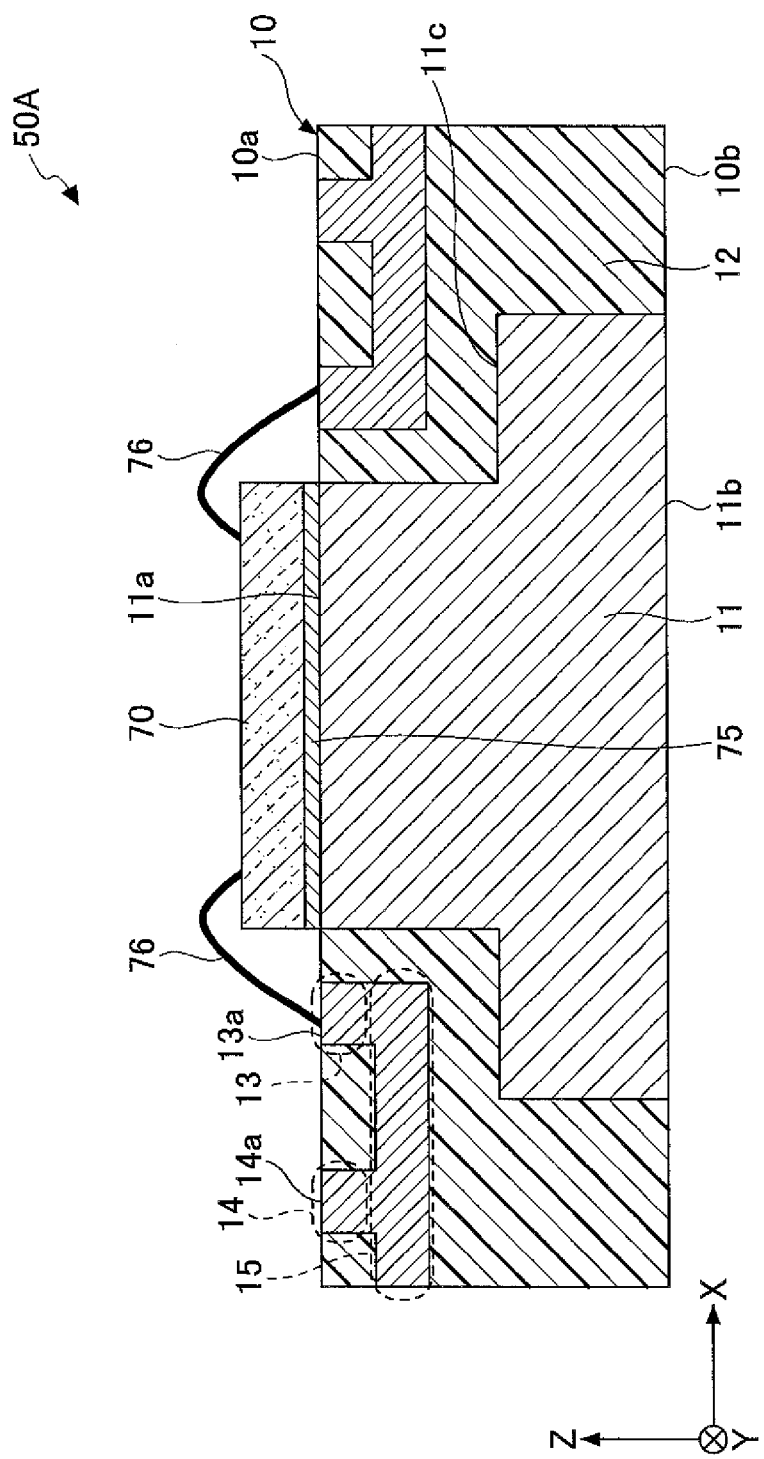
FIG. 24 is a cross-sectional view of an electronic device of a first modification of the fourth embodiment.

FIG. 24 is a cross-sectional view of an electronic device of the first modification of the fourth embodiment. As illustrated in FIG. 24, the electronic device 50A of the first modification of the fourth embodiment differs from the electronic device 50 of the fourth embodiment (FIG. 23) in that the semiconductor package 60 is replaced by a semiconductor chip 70 (bare chip) and a bonding wire 76.

The semiconductor chip 70 is, for example, a bare chip in which a semiconductor integrated circuit or an image sensor circuit, a protective layer, electrodes, etc. are fabricated on a semiconductor substrate which contains silicon (Si) as a main ingredient. The semiconductor chip 70 is not covered by the encapsulation resin 12. A bottom surface of the semiconductor chip 70 is bonded via an adhesion layer 75 to the first surface 11a of the heat sink 11 of the wiring substrate 10. One end of the bonding wire 76 is electrically connected to an electrode (not shown) of the semiconductor chip 70, and the other end of the bonding wire 76 is electrically connected to the end face 13a of the inner connection terminal 13 of the wiring substrate 10.

It is preferred to use a material with a sufficient thermal conductivity as a material of the adhesion layer 75. As a material of the adhesion layer 75, for example, solder, silver paste, etc. may be used. Alternatively, a non-conductive material may be used as a material of the adhesion layer 75. When a conductive material is used as a material of the adhesion layer 75, the conductive adhesion layer 75 is bonded to the bottom surface of the semiconductor chip 70 via an insulator layer. As a material of the bonding wire 76, an electric conductor line, such as gold (Au) and copper (Cu), may be used.

According to the first modification of the fourth embodiment, the semiconductor chip (bare chip) is mounted on the wiring substrate of the first embodiment, and it is possible to provide an electronic device which provides good heat dissipation with a low price.

Next, a second modification of the fourth embodiment will be described. Illustrated in the fourth embodiment is an example of the electronic device in which a semiconductor package as an example of an electronic part is mounted on the wiring substrate of the first embodiment. In the second modification of the fourth embodiment, another example of the electronic device in which a semiconductor package as an example of an electronic part is mounted on the wiring substrate of the first embodiment will be illustrated.

In the second modification of the fourth embodiment, the elements which are the same as corresponding elements in the foregoing embodiments and modifications are designated by the same reference numerals and a description thereof will be omitted.

Figure 25:
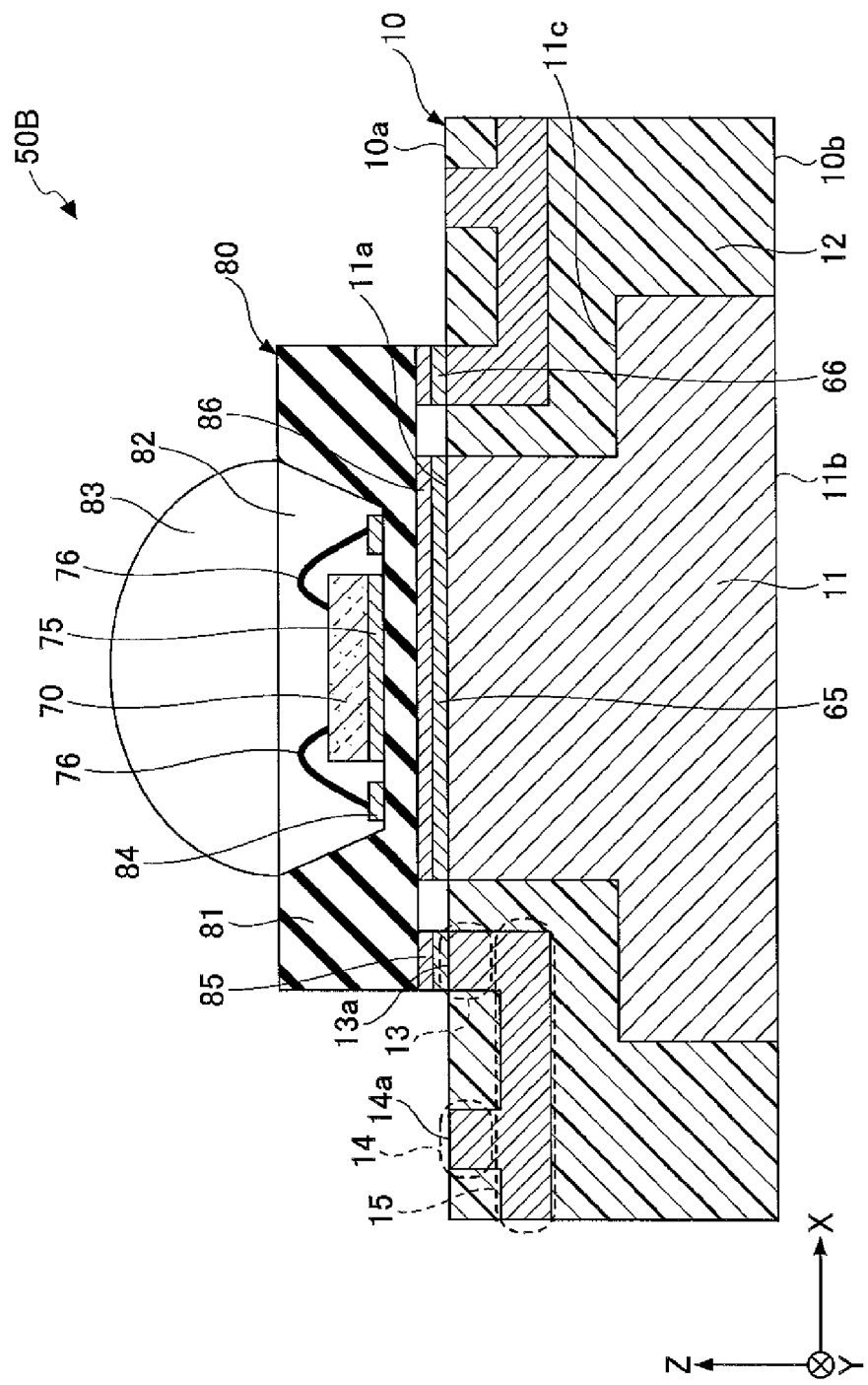
FIG. 25 is a cross-sectional view of an electronic device of a second modification of the fourth embodiment.

FIG. 25 is a cross-sectional view of an electronic device of the second modification of the fourth embodiment. As illustrated in FIG. 25, the electronic device 50B of the second modification of the fourth embodiment differs from the electronic device 50 of the fourth embodiment (FIG. 23) in that the semiconductor package 60 is replaced by a semiconductor package 80.

The semiconductor package 80 is an LED (light emitting diode) which is constructed to include a ceramic substrate 81, a phosphor part 82, and a lens 83. A semiconductor chip 70 which is an LED chip is bonded to the bottom of the recess of the ceramic substrate 81 via an adhesion layer 75. One end of a bonding wire 76 is electrically connected to an electrode (not shown) of the semiconductor chip 70, and the other end of the bonding wire 76 is electrically connected to an internal wiring 84 of the ceramic substrate 81.

The internal wiring 84 is electrically connected to a connection part 85 via the wiring (not shown) of the ceramic substrate 81. The connection part 85 is electrically connected to the end face 13a of the inner connection terminal 13 of the wiring substrate 10 via the conductive part 66. A connection part 86 is bonded via the adhesion layer 65 to the first surface 11a of the heat sink 11 of the wiring substrate 10.

According to the second modification of the fourth embodiment, the semiconductor package is mounted on the wiring substrate of the first embodiment, and it is possible to provide an electronic device which provides good heat dissipation with a low price.

As described in the foregoing, according to the present disclosure, it is possible to provide a wiring substrate which has a simple structure and provides good heat dissipation, a method of manufacturing the wiring substrate, and an electronic device in which an electronic part is mounted on the wiring substrate.

All examples and conditional language recited herein are intended for pedagogical purposes to aid the reader in understanding the principles of the present disclosure and the concepts contributed by the inventor to furthering the art, and are to be construed a being without limitation to such specifically recited examples and conditions, nor does the organization of such examples in the specification relates to a showing of the superiority and inferiority of the present disclosure. Although the embodiments of the present disclosure have been described in detail, it should be understood that the various changes, substitutions, and alterations could be made hereto without departing from the spirit and scope of the present disclosure.

For example, the heat sink in the second embodiment may be arranged similar to that in the first or second modification of the first embodiment. The plural heat sinks in the second modification of the second embodiment may be arranged by the single heat sink in the second embodiment. In the fourth embodiment, the wiring substrate of the first or second modification of the first embodiment, the wiring substrate of the second embodiment or the first or second modification thereof, or the wiring substrate of the third embodiment may be used instead of the wiring substrate of the first embodiment.

What is claimed is:

1. A wiring substrate in which an electronic part loading area is formed on a first principal surface, comprising:
    a heat sink arranged to dissipate outside heat generated in an electronic part to be mounted in the electronic part loading area;
    an encapsulation resin arranged to provide a base of the wiring substrate and cover the heat sink so that a first surface of the heat sink is exposed to the electronic part loading area of the first principal surface;
    an inner connection terminal formed in the electronic part loading area and having an end face which is exposed to the first principal surface and electrically connected to an electrode of the electronic part; and
    an outer connection terminal formed outside the electronic part loading area and electrically connected to the inner connection terminal via a wiring, the outer connection terminal having an end face which is exposed to the first principal surface and arranged to input a signal from an external device and output a signal to the external device,
    wherein the encapsulation resin is arranged to cover at least a part of the wiring, cover the inner connection terminal except the end face thereof, and cover the outer connection terminal except the end face thereof, and
    wherein the first surface of the heat sink, the end face of the inner connection terminal, and the end face of the outer connection terminal are flush with and exposed to the first principal surface.

2. The wiring substrate according to claim 1, wherein the inner connection terminal, the outer connection terminal, and the wiring are constituted by a single metal plate.

3. The wiring substrate according to claim 1, wherein a second surface of the heat sink that is opposite to the first surface is not covered by the encapsulation resin and exposed to the second principal surface of the wiring substrate.

4. The wiring substrate according to claim 1, wherein a groove is formed in the first surface of the heat sink.

5. The wiring substrate according to claim 4, wherein the groove is a cavity.

6. The wiring substrate according to claim 1, wherein a plurality of electronic part loading areas are formed on the first principal surface, the first surface of the heat sink is divided into a plurality of areas, and the divided areas of the first surface of the heat sink are exposed to the electronic part loading areas respectively.

7. The wiring substrate according to claim 1, wherein a plurality of electronic part loading areas are formed on the first principal surface, and a plurality of heat sinks are arranged, and respective first surfaces of the heat sinks are exposed to the electronic part loading areas.

8. The wiring substrate according to claim 1, wherein the heat sink has a multilayer structure.

9. The wiring substrate according to claim 8, wherein a material of an outermost layer of the heat sink exposed from the encapsulation resin has a corrosion resistance higher than that of a material of an internal layer of the heat sink.

10. The wiring substrate according to claim 9, wherein the material of the internal layer has a specific gravity smaller than that of the material of the outermost layer.

11. The wiring substrate according to claim 1, wherein the heat sink is made of an aluminum material subjected to alumite finishing.

12. An electronic device comprising:
    the wiring substrate according to claim 1; and
    an electronic part mounted in the electronic part loading area on the first principal surface of the wiring substrate.

13. A method of manufacturing a wiring substrate in which an electronic part loading area is formed on a first principal surface, the method comprising:
    a first step of integrally forming an inner connection terminal in the electronic part loading area and an outer connection terminal outside the electronic part loading area, the inner connection terminal having an end face which is exposed to the first principal surface and electrically connected to an electrode of an electronic part to be mounted, and the outer connection terminal electrically connected to the inner connection terminal via a wiring and having an end face which is exposed to the first principal surface and arranged to input a signal from an external device and output a signal to the external device;
    a second step of temporarily fixing the inner connection terminal, the outer connection terminal and a heat sink, which dissipates outside heat generated in the electronic part, to a surface of a supporting body, so that the end face of the inner connection terminal, the end face of the outer connection terminal and a first surface of the heat sink contact the surface of the supporting body;
    a third step of forming on the surface of the supporting body an encapsulation resin which provides a base of the wiring substrate and covers the inner connection terminal, the outer connection terminal, the wiring and the heat sink; and
    a fourth step of removing the supporting body so that the first surface of the heat sink, the end face of the inner connection terminal, and the end face of the outer connection terminal are flush with and exposed to the first principal surface.

14. The method of manufacturing the wiring substrate according to claim 13, wherein, in the first step, half etching of a single metal plate is performed so that the single metal plate constitutes the inner connection terminal, the outer connection terminal, and the wiring.

* * * * *